United States Patent
Hiroki et al.

(10) Patent No.: US 6,696,105 B2
(45) Date of Patent: Feb. 24, 2004

(54) THIN FILM FORMING DEVICE, THIN FILM FORMING METHOD, AND SELF-LIGHT EMITTING DEVICE

(75) Inventors: Masaaki Hiroki, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 105 days.

(21) Appl. No.: 09/790,234

(22) Filed: Feb. 21, 2001

(65) Prior Publication Data

US 2001/0017409 A1 Aug. 30, 2001

(30) Foreign Application Priority Data

Feb. 28, 2000 (JP) .......................................... 2000-050685
Mar. 27, 2000 (JP) .......................................... 2000-087702

(51) Int. Cl.$^7$ ............................... B05D 1/04; B05D 1/32
(52) U.S. Cl. ........................ 427/466; 427/466; 427/483; 427/66; 427/68; 427/282
(58) Field of Search ........................ 427/466, 468, 427/469, 483, 485–486, 58, 64, 66, 68, 282; 118/504

(56) References Cited

U.S. PATENT DOCUMENTS

| | | | |
|---|---|---|---|
| 3,060,429 A | 10/1962 | Winston | 346/1 |
| 3,147,142 A | * 9/1964 | Rudo | |
| 3,416,153 A | 12/1968 | Hertz et al. | 346/75 |
| 3,596,275 A | 7/1971 | Sweet | 346/1 |
| 3,747,120 A | 7/1973 | Stemme | 346/75 |
| 3,946,398 A | 3/1976 | Kyser et al. | 346/1 |
| 4,226,182 A | * 10/1980 | Danielsen et al. | |
| 4,620,196 A | 10/1986 | Hertz et al. | 346/1.1 |
| 5,247,190 A | 9/1993 | Friend et al. | 257/40 |
| 5,264,376 A | 11/1993 | Abbott et al. | |
| 5,344,676 A | * 9/1994 | Kim et al. | |
| 5,399,502 A | 3/1995 | Friend et al. | 437/1 |
| 5,583,552 A | 12/1996 | Mutoh | 347/80 |
| 5,811,020 A | * 9/1998 | Alwan | |
| 5,916,729 A | * 6/1999 | Kobayashi et al. | |
| 5,952,037 A | * 9/1999 | Nagayama et al. | |
| 6,300,021 B1 | 10/2001 | Gorog et al. | |
| 6,348,359 B1 | 2/2002 | Van Slyke et al. | |
| 6,403,392 B1 | 6/2002 | Burrows et al. | |
| 2002/0031874 A1 | 3/2002 | Yamazaki et al. | |

FOREIGN PATENT DOCUMENTS

| | | |
|---|---|---|
| EP | 0 880 303 | 11/1998 |
| EP | 0 892 028 | 1/1999 |
| JP | 10-012377 | 1/1998 |
| JP | 10-092576 | 4/1998 |
| JP | 10-153967 | 6/1998 |
| JP | 11-040358 | 2/1999 |
| JP | 11-054270 | 2/1999 |
| JP | 11-054272 | 2/1999 |
| WO | WO 90/13148 | 11/1990 |

OTHER PUBLICATIONS

Sweet, R.G., "High Frequency Recording with Electrostatically Deflected Ink Jets," The Review of Scientic Instruments, vol. 36, No. 2, pp. 131–136, Feb., 1965.

Pimbley, W.T. et al, "Satellite Droplet Formation in a Liquid Jet," IBM J. Res. Develop., vol. 21, No. 1, pp. 21–30, Jan., 1977.

Hertz, C.H. et al, "Ink Jet Printing of High Quality Color Images," Journal of Imaging Technology, vol. 15, No. 3, pp. 141–148, Jine, 1989.

(List continued on next page.)

Primary Examiner—Fred J. Parker
(74) Attorney, Agent, or Firm—Cook, Alex, McFarron, Manzo, Cummings & Mehler, Ltd.

(57) ABSTRACT

A method for selectively coating a coating liquid on a desired coating position when the coating liquid for forming an EL layer is coated. When the coating liquid is coated, a mask is provided between a coating liquid chamber and a substrate, and a voltage is applied to the mask, so that the coating liquid can be selectively coated on the desired coating position.

33 Claims, 23 Drawing Sheets

OTHER PUBLICATIONS

Kimura, M. et al, "Low–Temperature Poly–Si TFT Driven Light–Emitting Polymer Displays and Digital Gray Scale for Uniformity," IDW '99, pp. 171–174, 1999.

Hunter, I.M. et al, "Design of an Active Matrix Polymer–LED Display with Reduced Horizontal Cross–Talk," IDW '99, pp. 1095–1096, 1999.

Shimoda, T. et al, "Technology for Active Matrix Light Emitting Polymer Displays," IDEM 99, pp. 107–110, 1999.

Lee, J.D. et al, "Two–Dimensional Nozzle Arrangement in a Monolithic Inkjet Printhead for High–Resolution and High–Speed Printing," IDEM 99, pp. 127–130, 1999.

English abstract for Japanese Patent Application No. JP 11–040358.

English abstract for Japanese Patent Application No. JP 11–054270.

English abstract for Japanese Patent Application No. JP 11–054272.

Tsutsui, T. et al, "Electroluminescence in Organic Thin Films," Photochemical Processes in Organized Molecular Systems, pp. 437–450, 1991.

Baldo, M.A. et al, "Highly Efficient Phosphorescent Emission from Organic Electroluminescent Devices," Nature, vol. 395, pp. 151–154, Sep. 10, 1998.

Baldo, M.A. et al, "Very High–Efficiency Green Organic Light–Emitting Devices Based on Electrophosphorescence," Applied Physics Letters, vol. 75, No. 1, pp. 4–6, Jul. 5, 1999.

Schenk, H. et al, "Polymers for Light Emitting Diodes," EURODISPLAY '99, Proceedings of the 19th International Display Research Conference, Sep. 6–9, 1999, Berlin, Germany, pp. 33–37.

Tsutsui, T. et al, "High Quantum Efficiency in Organic Light–Emitting Devices with Iridium–Complex as a Triplet Emissive Center," Japanese Journal of Applied Physics, vol. 38, part 2, No. 12B, pp. L1502–L1504, Dec. 15, 1999.

English abstract re Japanese Patent Application No. 10–012377, published Jan. 16, 1998.

English abstract re Japanese Patent Application No. 10–092576, published Apr. 10, 1998.

English abstract re Japanese Patent Application No. 10–153967, published Jun. 9, 1998.

English abstract re Japanese Patent Application No. 11–054270, published Feb. 26, 1999.

* cited by examiner

Enlarged View of 1017

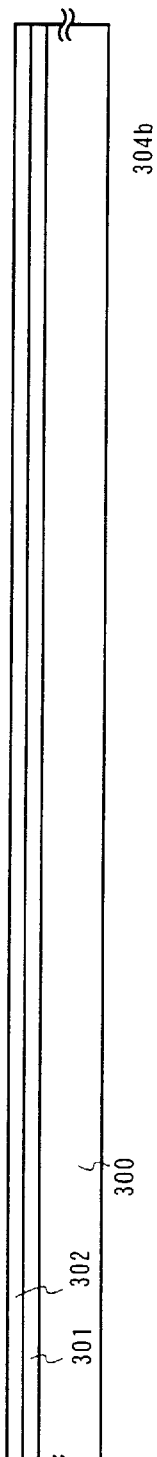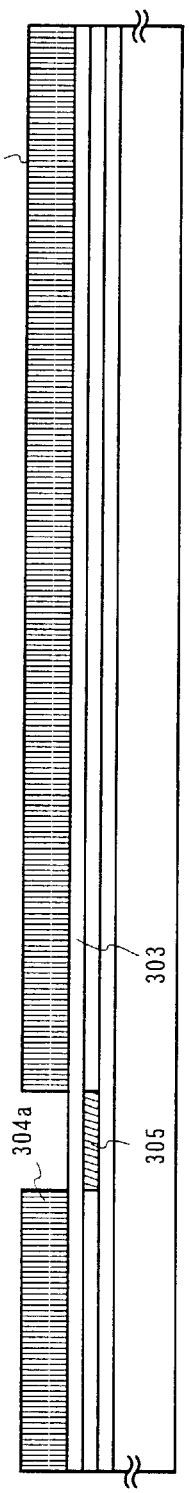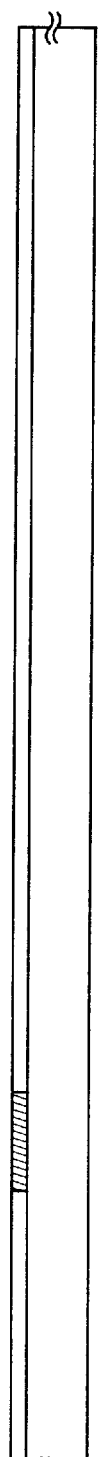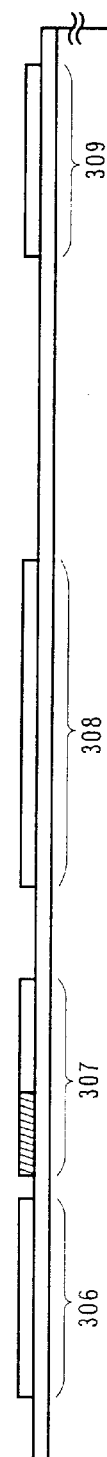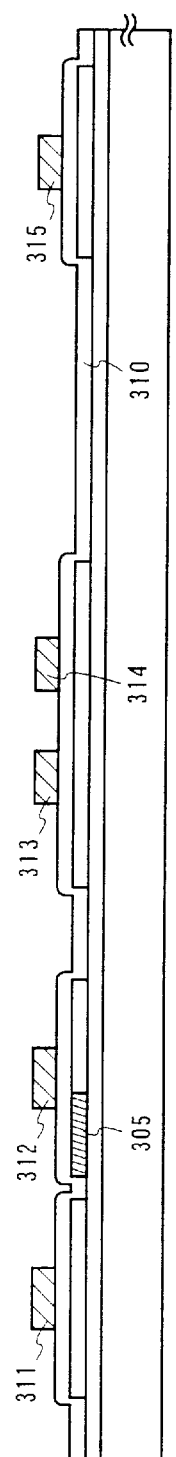

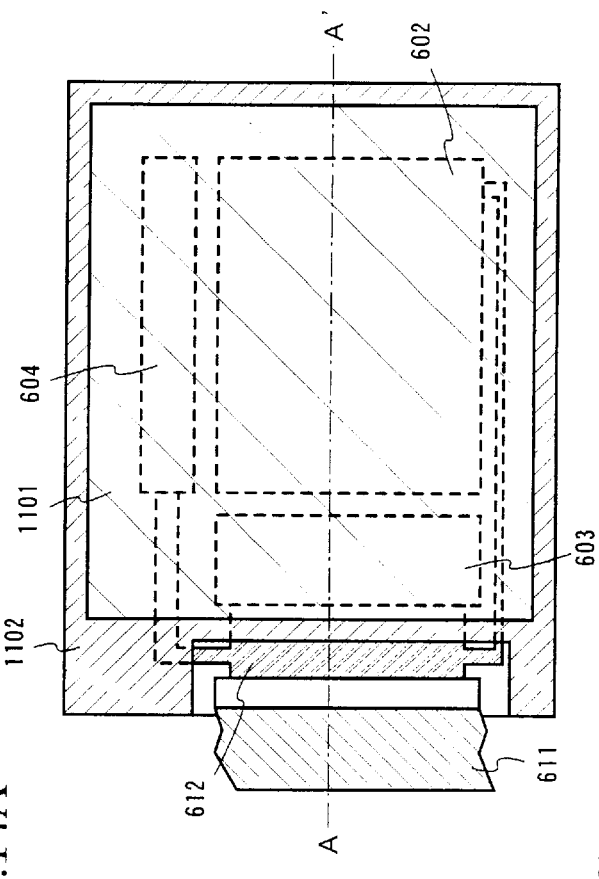
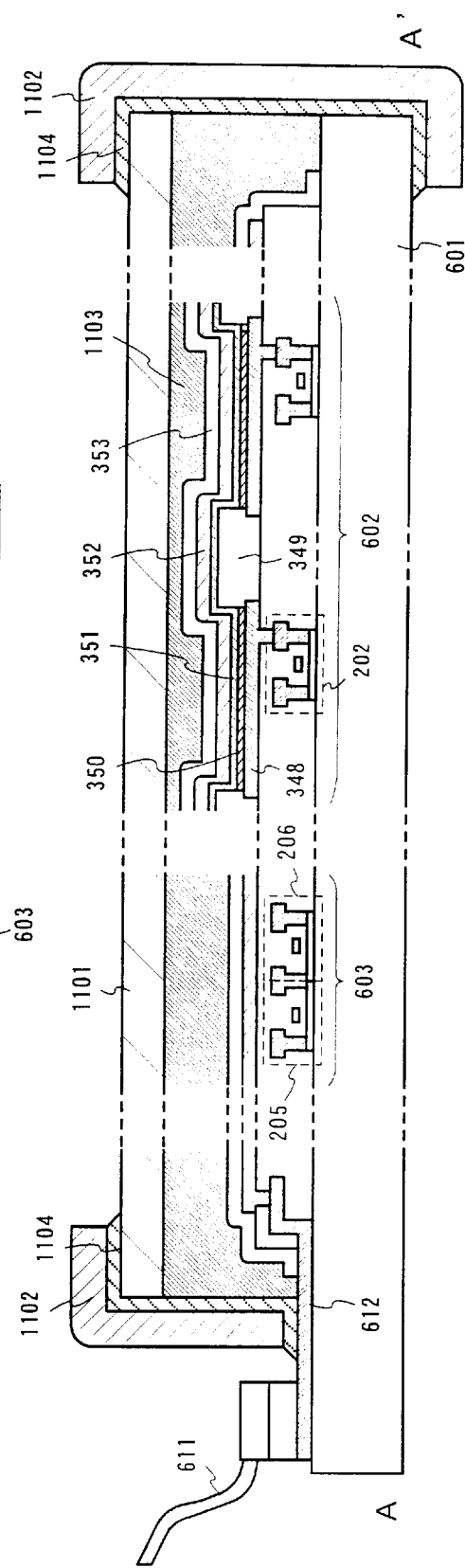
Fig.14A
Fig.14B

THIN FILM FORMING DEVICE, THIN FILM FORMING METHOD, AND SELF-LIGHT EMITTING DEVICE

BACKGROUND OF THE INVENTION

1. Field of the Invention

The present invention relates to a self-light-emitting device in which an EL element having a structure of an anode, a cathode and a light-emitting organic material (hereinafter referred to as an organic EL material) which generates EL (Electro Luminescence) and is sandwiched between them, is formed on an insulator, to an electronic instrument including the self-light-emitting device as a display portion (display or display monitor), to a thin film forming method of the organic EL material, and to a thin film forming device. Note that the self-light-emitting device is also called an OLED (Organic Light-Emitting Diodes).

2. Description of the Related Art

In recent years, a self-light-emitting device (EL display device) using an EL element, as a self-light-emitting element using an EL phenomenon of a self-light-emitting organic material, has been developed. Since the EL display device is a self-light-emitting type, a backlight as in a liquid crystal display device is not necessary, and further, since an angle of visibility is wide, it is considered to be hopeful as a display portion of an electronic instrument.

The EL display device has two kinds, that is, a passive type (simple matrix type) and an active type (active matrix type), and both have been earnestly developed. Especially, at present, attention is paid to an active matrix type EL display device. As an organic EL material which becomes an EL layer regarded as the center of an EL element, although a low molecular organic EL material and a high molecular (polymer) organic EL material are studied, attention is paid to the polymer organic EL material which is easier to handle than the low molecular organic EL material and has high heat resistance.

As a film growth method of the polymer organic EL material, an inkjet method proposed by Seiko Epson Corporation is considered to be promising. With respect to this technique, reference may be made to Japanese Patent Applications Laid-open No. Hei 10-12377, No. Hei 10-153967, No. Hei 11-54270, etc.

However, in the inkjet method, since the polymer organic EL material is jetted out, there can occur a problem of so-called flying deflection in which a droplet is coated on a portion except a necessary portion unless a distance between a coated surface and a nozzle of a head for inkjet is made suitable. The flying deflection is disclosed in detail in Japanese Patent Application Laid-open No. Hei 11-54270, and it is definitely disclosed that there can occur a deviation of 50 μm or more from a target position to be coated.

SUMMARY OF THE INVENTION

The present invention has been made in view of the above problems, and has an object to provide means for forming a thin film by selectively coating an organic EL material made of polymer for every line or area, not by a spin coating method. Besides, the present invention provides a thin film forming device. Another object of the present invention is to provide a self-light-emitting device using such means and a method of fabricating the same. Still another object of the present invention is to provide an electronic instrument including such a self-light-emitting device as a display portion.

With respect to a coating liquid used for achieving the above objects, a solution is prepared by selecting a solvent with high solubility to an organic EL material. Note that, in the present specification, coating liquid for an EL layer in which the organic EL material is dissolved in the solvent is referred to as the coating liquid.

In the present invention, the coating liquid is contained in a coating liquid chamber, and when it is extracted by an electric field, its flying direction is controlled by an electric field generated by a voltage applied to a mask before it reaches a substrate, and a coating position can be controlled.

BRIEF DESCRIPTION OF THE DRAWINGS

FIGS. 8A to 8E are views showing fabricating steps of an EL display device;

FIGS. 14A and 14B are views showing a sectional structure of an active matrix type EL display device;

DETAILED DESCRIPTION OF THE PREFERRED EMBODIMENTS (Embodiment Mode 1)

First, Embodiment Mode 1 for carrying out the present invention will be described with reference to FIGS. 1A to 1C.

Figure 1A:
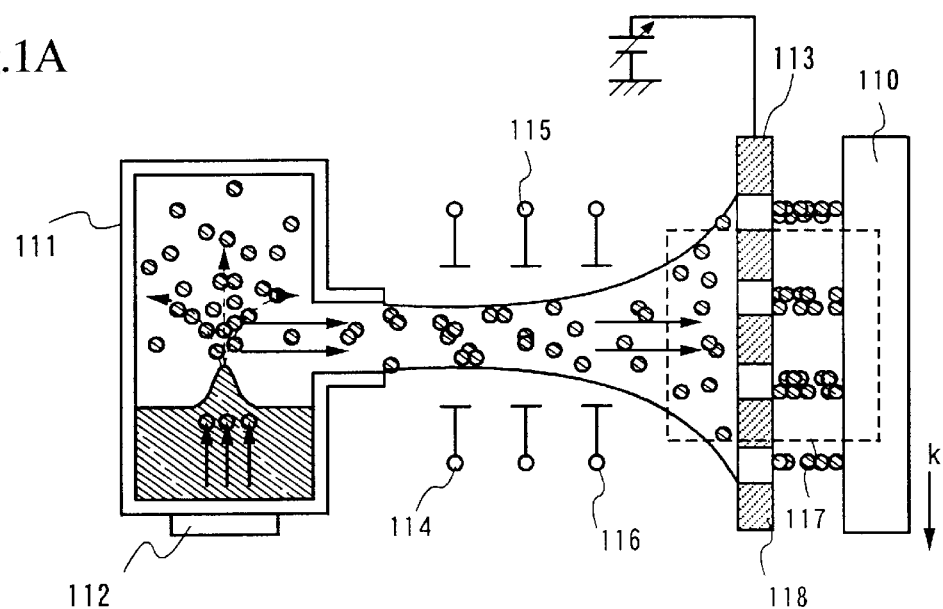
FIGS. 1A to 1C are views showing a coating method of an organic EL material of the present invention (Embodiment 1)

FIG. 1A is a view schematically showing a state where a film is formed from an organic EL material made of π—conjugated polymer by carrying out the present invention. In FIG. 1A, reference numeral 110 designates a substrate; and 111, a coating liquid chamber. The coating liquid chamber 111 contains a coating liquid.

When a red EL layer is formed, the coating liquid chamber 111 contains a mixture (hereinafter referred to as a red EL layer coating liquid) of an organic EL material emitting red light and a solvent, when a green EL layer is formed, the coating liquid chamber 111 contains a mixture (hereinafter referred to as a green EL layer coating liquid) of an organic EL material emitting green light and a solvent, and when a blue EL layer is formed, the coating liquid chamber 111 contains a mixture (hereinafter referred to as a blue EL layer coating liquid) of an organic EL material emitting blue light and a solvent.

As a typical solvent, there is named ethanol, xylene, chlorobenzene, dichlorobenzene, anisole, chloroform, dichloromethane, ā-butyllactone, butyl cellosolve, cyclohexane, NMP (N-methyl-2-pyrrolidone), cyclohexanone, dioxane, or THF (tetrahydrofuran).

Concerning the organic EL material, there are a method of directly dissolving a polymerized material in a solvent and coating it, and a method of forming a film of a monomer dissolved in a solvent and then heating and polymerizing it into a polymer, and both may be used in the present invention. Here, an example in which an organic EL material of polymer is dissolved in a solvent and is coated, will be described.

In the case of the present invention, the coating liquid in the coating liquid chamber 111 is atomized by an ultrasonic vibrator 112 and is discharged. After the discharged coating liquid passes through a gap of a mask 113 made of conductive material, it is coated on a pixel electrode over the substrate 110.

Figure 1B:
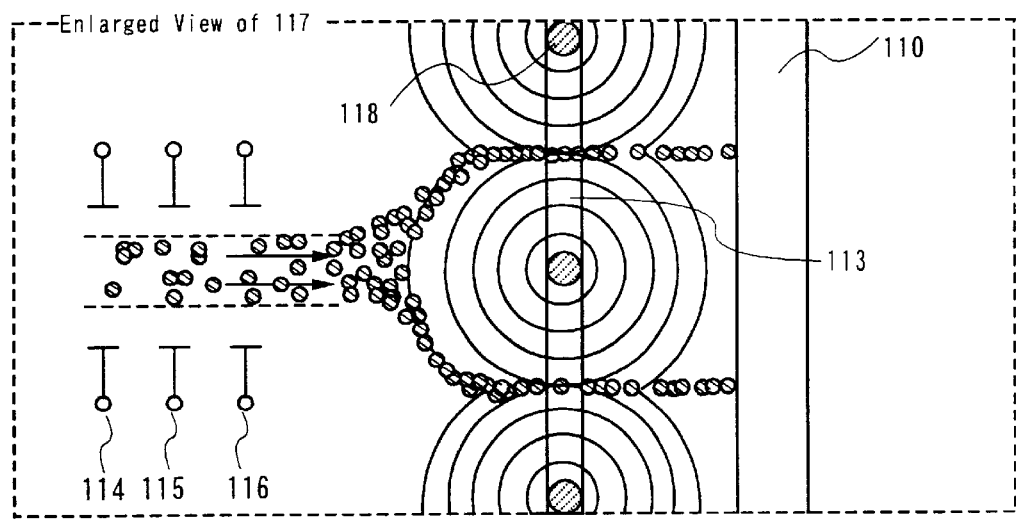

When the coating liquid passes through the mask 113, its flying direction is controlled by the mask, as shown in FIG. 1B of an enlarged view of a portion 117. As shown in FIG. 1C, the mask 113 is stripe-shaped or mesh-shaped and the blocking portions 118 are made of conductive material such as platinum (Pt), gold (Au), copper, iron, aluminum, tantalum, titanium, or tungsten. The coating liquid is controlled by a voltage applied to the blocking portions 118, passes through the gap between the blocking portions 118, and is coated on the substrate.

Note that the voltage is applied to the blocking portions 118 of the mask 113 to produce a potential at which the atomized coating liquid and the blocking portions 118 of the mask 113 repel each other. Accordingly, the coating liquid can pass through the gap between the blocking portions 118 of the mask 113.

Figure 1C:
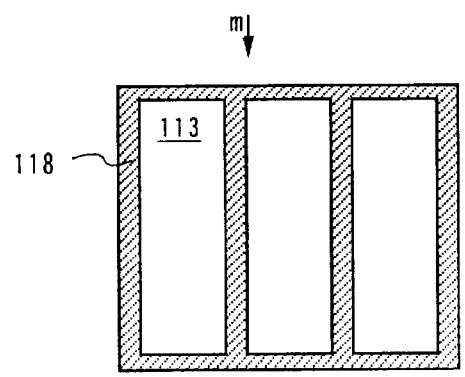

The stripe-shaped mask 113 of FIG. 1B is obtained when the mask 113 shown in FIG. 1C is seen from the direction of arrow m.

The gap between the blocking portions 118 may be made a pixel pitch of pixel electrodes formed over the substrate.

First, when the coating liquid for a red EL layer is coated while the coating liquid chamber 111 is moved in the vertical direction to the sheet plane, stripe-shaped red EL layers are formed on pixels.

Next, after the mask is moved in the direction of arrow k by one pixel array, the coating liquid for a green EL layer is coated from the coating liquid chamber 111. Also at this time, coating is carried out while the coating liquid chamber 111 is moved in the vertical direction to the sheet plane so that green EL layers are formed. Further, the mask is moved in the direction of the arrow k by one pixel array, and coating is similarly carried out while the coating liquid chamber 111 is moved in the vertical direction to the sheet plane so that blue EL layers are formed.

That is, pixel arrays emitting red, green and blue lights are coated three times for the respective colors while the mask is moved in the direction of the arrow k, so that the three-color stripe-shaped EL layers (strictly speaking, precursors of the EL layers) are formed. It is desirable that the thickness of each EL layer formed here is 10 nm to 1 μm. Note that, here, although the method of coating while the coating liquid chamber 111 is moved in the vertical direction to the sheet plane is described, a method of coating while the substrate 110 is moved in the vertical direction to the sheet plane may be used. Besides, three-color EL layers may be formed at the same time.

The pixel array here indicates an array of pixels divided by a bank (not shown), and the bank is formed like an embankment over a source wiring of the pixel array so as to fill a gap between pixels. That is, an array in which a plurality of pixels are arranged in series along the source wiring is referred to as the pixel array. However, here, although the case where the bank is formed over the source wiring has been explained, it may be provided over a gate wiring. In this case, an array in which a plurality of pixels are arranged in series along the gate wiring is referred to as the pixel array.

Accordingly, a pixel portion (not shown) on pixel electrodes can be regarded as a collective of a plurality of pixel arrays divided by stripe-shaped banks provided over a plurality of source wirings or a plurality of gate wirings. When the pixel portion is regarded as such, it can be said that the pixel portion on the pixel electrodes is constituted by the pixel arrays in which stripe-shaped EL layers emitting red light are formed, the pixel arrays in which stripe-shaped EL layers emitting green light are formed, and the pixel arrays in which stripe-shaped EL layers emitting blue light are formed.

Since the stripe-shaped banks are provided over the plurality of source wirings or the plurality of gate wirings, the pixel portion can also be substantially regarded as a collective of a plurality of pixel arrays divided by the plurality of source wirings or the plurality of gate wirings.

Incidentally, reference numeral 114 shown in FIG. 1 designates an extracting electrode which applies an electric field for extracting the atomized coating liquid to a next electrode. Reference numeral 115 designates an acceleration electrode which applies to the coating liquid an electric field for accelerating the flying speed of the extracted coating liquid. Further, reference numeral 116 designates a control electrode which is an electrode for applying a voltage to make electric field control so that the coating liquid can be coated on a desired position on the substrate 110. It is not always necessary that the number of these electrodes is three.

Embodiment Mode 2

Next, Embodiment Mode 2 for carrying out the present invention will be described with reference to FIGS. 2A and 2B.

In order to further improve controllability than Embodiment Mode 1, another means of electric field control may be provided between a mask and a substrate. FIG. 2A is a view schematically showing an example in which electric field control is carried out using a plurality of masks.

Figure 2A:
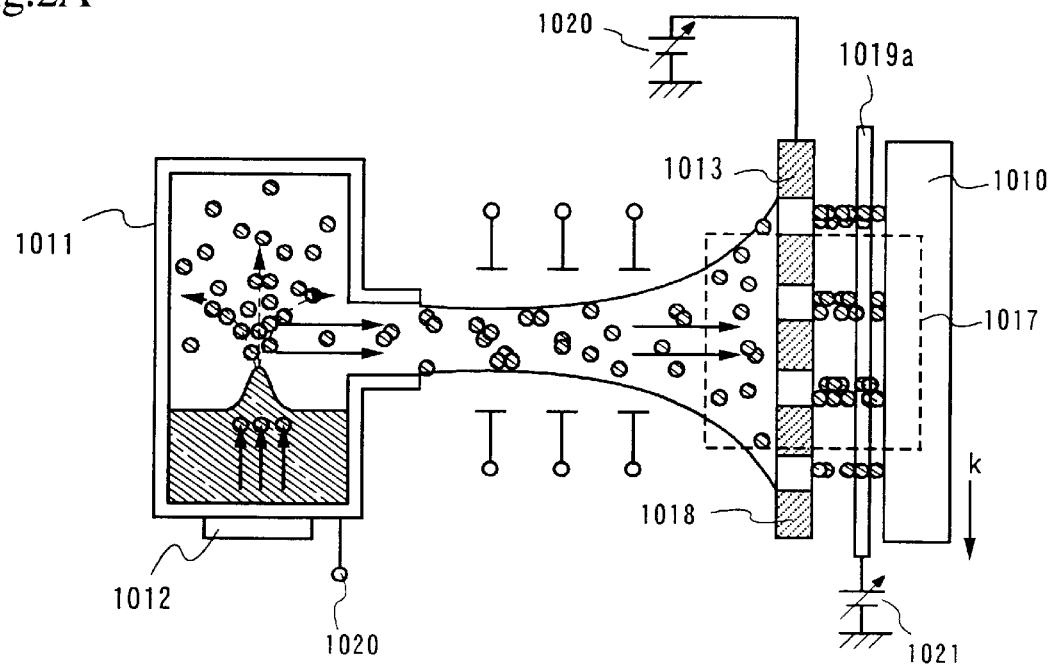
FIGS. 2A to 2B are views showing a coating method of an organic EL material of the present invention (Embodiment 3)

In FIG. 2A, reference numeral 1010 designates a substrate; and 1011, a coating liquid chamber. The coating liquid chamber 1011 contains a coating liquid. Here, an example in which an organic EL material as a polymer is dissolved in a solvent and is coated, will be described.

The coating liquid of the coating liquid chamber 1011 is atomized by an ultrasonic vibrator 1012 and is discharged. An electrode 1020 is connected to the coating liquid chamber 1011, and a potential is previously applied to the coating liquid when it is discharged. Next, the discharged coating liquid passes through gaps of a first mask 1013 made of conductive material, and after passing through gaps of a second mask 1019a, the coating liquid is coated on pixel electrodes over the substrate 1010.

Figure 2B:
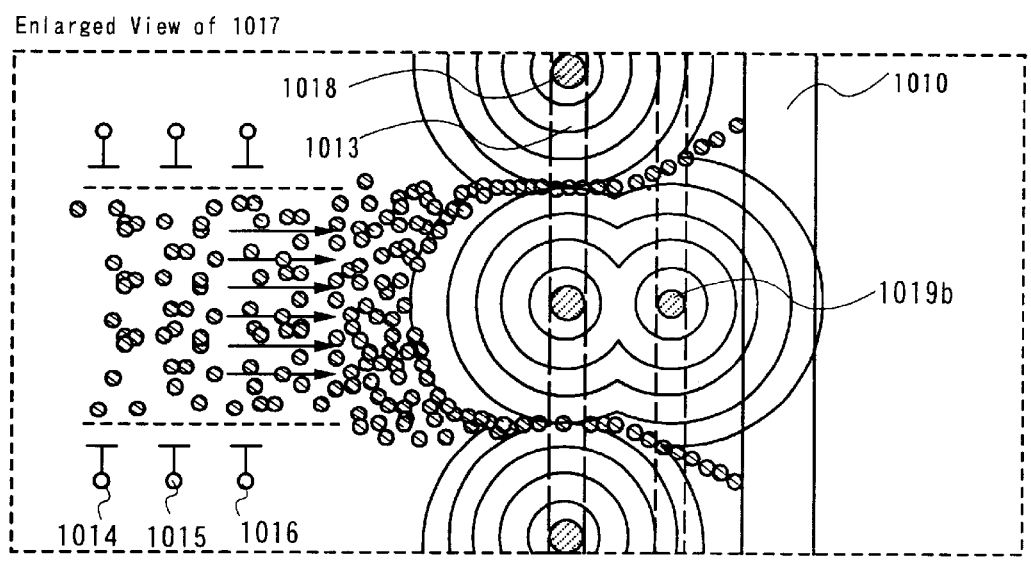

When the coating liquid passes through the first mask 1013, its flying direction is controlled by the first mask, as shown in FIG. 2B of an enlarged view of a portion 1017. The first mask 1013 is structured such that portions of the first blocking portions 1018 are a plurality of conductive lines each made of conductive material such as platinum (Pt), gold (Au), copper, iron, aluminum, tantalum, titanium, or tungsten, and arranged in parallel with each other (stripe shape) or are a net-shaped structure (mesh shape). When the coating liquid having passed through the first mask 1013 passes through the second blocking portions 1019b, the flying direction is controlled, as shown in FIG. 2B of the enlarged view of the portion 1017. Accordingly, the coating liquid is controlled by a first voltage (set by a first power supply 1020) applied to the first blocking portions 1018 and a second voltage (set by a second power supply 1021) applied to the second blocking portions 1019b, passes through gaps between the respective first blocking portions 1018 and gaps between the respective second blocking portions 1019b, and is coated on the substrate. The second mask 1019a has the second blocking portions 1019b which are conductive lines each made of conductive material such as platinum (Pt), gold (Au), copper, iron, aluminum, tantalum, titanium, or tungsten, has a net-like structure made of the conductive lines, has a plate-like structure made of conductive material, or has a structure in which a plurality of conductive lines are arranged in parallel with each other.

Although FIG. 2 shows an example in which the sectional shape is circular, the shape is not particularly limited, but may be rectangular, elliptical or polygonal.

Note that a distance between the first mask 1013 and the second mask 1019a, a distance between the second mask 1019a and the substrate, a distance between the respective first blocking portions 1018, a distance between the respective second blocking portions 1019b, and the like may be suitably set by an operator. For example, it is appropriate that the distance between the respective first blocking portions 1018 or the distance between the respective second blocking portions 1019b is made a pixel pitch of the pixel electrodes formed over the substrate.

In order to accurately align the first mask 1013 and the second mask 1019a, the first mask 1013 and the second mask 1019a may be formed in such a manner that two conductive plates are stacked, and slit-shaped or circle-shaped holes are cut by discharge working at the same time.

Although FIG. 2B shows the example in which the flying direction of the coating liquid to the substrate is controlled mainly by the second blocking portions 1019b, the invention is not particularly limited, but the flying direction to the substrate may be controlled by the first blocking portion after the coating liquid passes through the second blocking portion, by changing the position where the second blocking portion is provided. Besides, although the example using the two masks is described here, the flying direction of the coating liquid may be controlled by applying voltage to two or more masks. Besides, the flying direction of the coating liquid may be controlled by applying voltage to a combination of two or more masks on one plane.

Note that the voltage (set by the first power supply 1020) is applied to the first blocking portions 1018 of the first mask 1013 to produce such a potential that the atomized coating liquid and the first blocking portions 1018 of the first mask 1013 repel each other. Besides, the voltage (set by the second power supply 1021) is applied to the second blocking portions 1019b of the second mask 1019a to produce such a potential that the atomized coating liquid and the second blocking portions 1019b repel each other. Accordingly, the coating liquid can pass through the gaps between the respective first blocking portions 1018 of the first mask 1013 and the gaps between the respective second blocking portions 1019b of the second mask 1019a.

The coating position can be controlled with high accuracy by making the structure as shown in FIG. 2A and by suitably adjusting the first voltage applied to the first blocking portions 1018 and the second voltage applied to the second blocking portions 1019b within the range of several tens of V to 10 kV.

Embodiment Mode 3

Next, Embodiment Mode 3 for carrying out the present invention will be described with reference to FIGS. 3A to 3B.

Figure 3A:
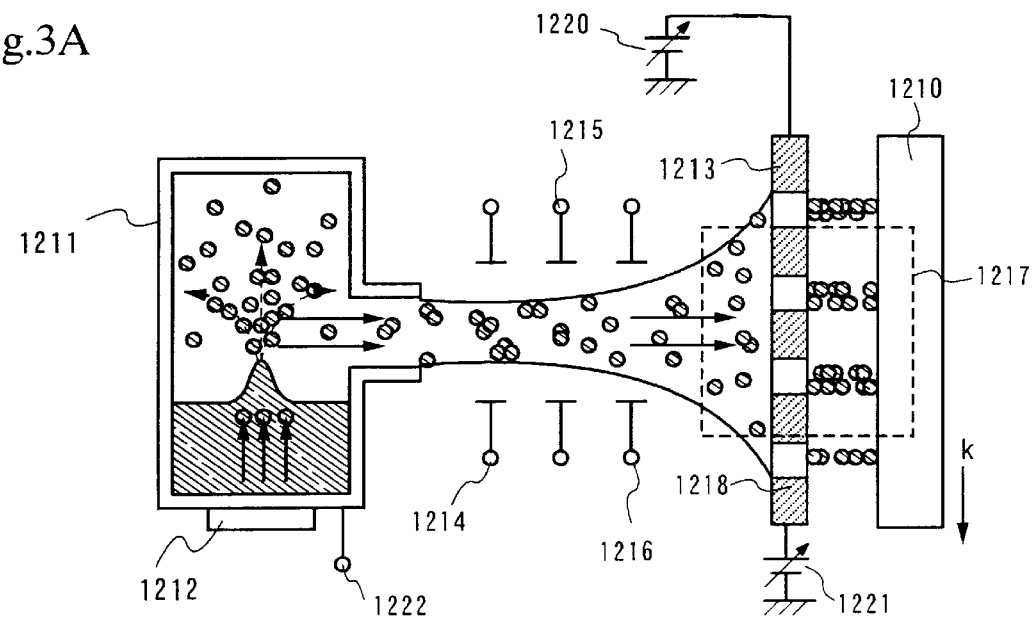
FIGS. 3A to 3C are views showing a coating method of an organic EL material of the present invention (Embodiment 10)

FIG. 3A is a view schematically showing an example in which a coating position is controlled by using a mask to which different voltages are partially applied. The coating position may be controlled in such a manner that a first voltage (controlled by a first power supply 1220) is applied to the blocking portions 1218a of the mask, and a second voltage (controlled by a second power supply 1221) is applied to of the blocking portions 1218b of the mask, to control the flying direction of a coating liquid.

Figure 3B:
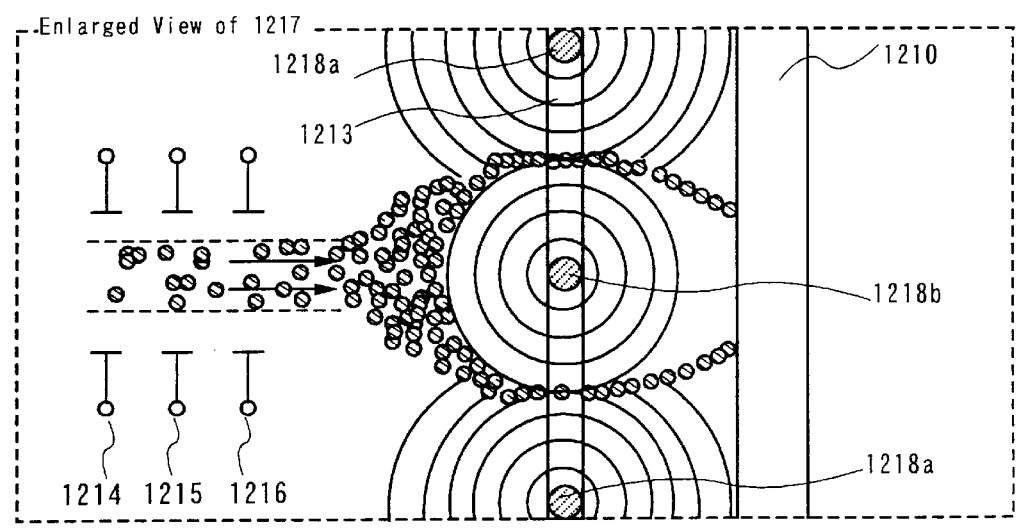

Note that, when the coating liquid passes through the mask 1213, as shown in FIG. 3B of an enlarged view of a portion 1217, the flying direction is controlled by the blocking portions 1218a and 1218b. Incidentally, the example shown in FIG. 3B is a case where the second voltage is lower than the first voltage.

Figure 3C:
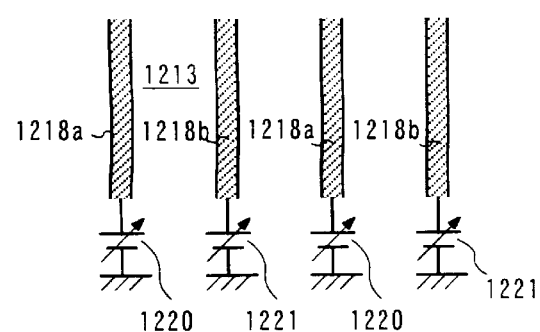

When the mask 1213 shown in FIG. 3C is seen from the direction of arrow m, the stripe-shaped mask 1213 of FIG. 3B is obtained.

Embodiment Mode 3 may be combined with Embodiment Mode 2.

Further, in the above Embodiment Modes 1 to 3, an electric field may be applied such that a voltage is previously applied to the pixel electrodes (anodes) formed over the substrate, and the coating liquid having passed through the mask is further controlled to be selectively coated on a desired position.

Besides, in the above Embodiment Modes 1 to 3, the controllability of the coating position may be further raised by giving electric charge to the coating liquid, extracting the coating liquid as charged particles, and controlling the respective charged particles by an electric field.

Next, preferred embodiments of the present invention will be described below.

Embodiment 1

In this embodiment, a method in which a coating liquid atomized in a coating liquid chamber is controlled by an electric field and a film is formed on a substrate, will be described. Note that a coating method in this embodiment uses FIGS. 1A to 1C.

In FIG. 1A, reference numeral 110 designates the substrate; and 111 is the coating liquid chamber. The coating liquid chamber 111 contains the coating liquid.

When a red EL layer is formed, the coating liquid chamber 111 contains a mixture (hereinafter referred to as a red EL layer coating liquid) of an organic EL material emitting red light and a solvent, when a green EL layer is formed, the coating liquid chamber 111 contains a mixture (hereinafter referred to as a green EL layer coating liquid) of an organic EL material emitting green light and a solvent, and when a blue EL layer is formed, the coating liquid chamber 111 contains a mixture (hereinafter referred to as a blue EL layer coating liquid) of an organic EL material emitting blue light and a solvent.

Note that, in this embodiment, as the organic EL material, cyanopolyphenylenevinylene is used for the red EL layer, polyphenylenevinylene is used for the EL layer emitting green light, and polyalkylphenylene is used for the EL layer emitting blue light. As the solvent, ethanol is used.

In this embodiment, coating liquid for the red EL layer is first contained in the coating liquid chamber, and after red EL layers are formed on the substrate, green EL layers are formed on the substrate using the coating liquid chamber containing coating liquid for the green EL. Finally, blue EL layers are formed on the substrate by using the coating liquid chamber containing coating liquid for the blue EL layer.

As described above, the EL layers for the red, green and blue can be formed by coating three times. Besides, three-color EL layers may be formed at the same time.

The coating liquid of each color is atomized in the coating liquid chamber by the ultrasonic vibrator 112 and is extracted by an electric field given from the extracting electrode 114. The coating liquid extracted by the extracting electrode 114 is accelerated by an electric field given from the acceleration electrode 115, and then, it is controlled by an electric field given from the control electrode 116, and reaches the mask 113.

Since a voltage is applied to the mask 113, an electric field is generated in the vicinity of the mask 113. The coating liquid having reached the mask 113 is controlled by the electric field generated by the mask 113, and then, it passes through the mask 113 and is coated on the substrate 110.

When the coating liquid for a red EL layer is coated while the coating liquid chamber 111 is moved in the vertical direction to the sheet plane, stripe-shaped red EL layers are formed on pixels. Here, the mask is moved in the direction of the arrow k by one pixel array, and the coating liquid for a green EL layer is similarly coated from the coating liquid chamber 111 while the coating liquid chamber 111 is moved in the vertical direction to the sheet plane. Accordingly, green EL layers are formed at the sides of the red EL layers. Further, the mask is moved in the direction of the arrow k by one pixel array, and the coating liquid for a blue EL layer is coated from the coating liquid chamber 111. Blue EL layers are formed at the sides of the green EL layers. That is, as described above, the pixel arrays emitting red, green and blue are coated three times for the respective colors while the mask is moved, so that the three-color stripe-shaped EL layers (strictly speaking, precursors of the EL layers) are formed. Note that it is desirable that the thickness of each EL layer formed here is 100 nm to 1 $\mu$m. Besides, three-color EL layers may be formed at the same time.

Note that the pixel array here indicates an array of pixels divided by a bank (not shown), and the bank is formed over a source wiring. That is, an array in which a plurality of pixels are arranged in series along the source wiring is referred to as the pixel array. However, here, although the case where the bank is formed over the source wiring has been explained, it may be provided over a gate wiring. In this case, an array in which a plurality of pixels are arranged in series along the gate wiring is referred to as the pixel array.

Accordingly, the pixel portion (not shown) can be regarded as a collective of a plurality of pixel arrays divided by stripe-shaped banks provided over a plurality of source wirings or a plurality of gate wirings. When the pixel portion is regarded as such, it can be said that the pixel portion is constituted by the pixel arrays in which stripe-shaped EL layers emitting red light are formed, the pixel arrays in which stripe-shaped EL layers emitting green light are formed, and the pixel arrays in which stripe-shaped EL layers emitting blue light are formed.

Besides, since the stripe-shaped banks are provided over the plurality of source wirings or the plurality of gate wirings, the pixel portion can also be regarded substantially as a collective of the plurality of pixel arrays divided by the plurality of source wirings or the plurality of gate wirings.

Incidentally, reference numeral 114 shown in FIG. 1A designates the extracting electrode which applies the electric field for extracting the atomized coating liquid to the next electrode. Reference numeral 115 designates the acceleration electrode which applies to the coating liquid the electric field for accelerating the flying speed of the extracted coating liquid. Further, reference numeral 116 designates the control electrode which is the electrode for controlling the electric field so that the coating liquid can be coated on a desired position on the substrate 110. It is not always necessary that the number of these electrodes is three, but it is sufficient if at least one electrode is provided.

Further, in this embodiment, an electric field may be applied such that a voltage is previously applied to the pixel electrodes (anodes) formed over the substrate 110, and the coating liquid having passed through the mask is further controlled to be selectively coated on the desired position.

Embodiment 2

Next, an example will be given, in which a piezo system (also called an MJ system of Seiko Epson Corporation) used for an inkjet printer because of excellent controllability of an ink droplet and a high degree of freedom in ink selection is used for the present invention.

The piezo system includes an MLP (Multi Layer Piezo) type and an MLChip (Multi Layer Ceramic Hyper Integrated Piezo Segments) type.

Figure 4:
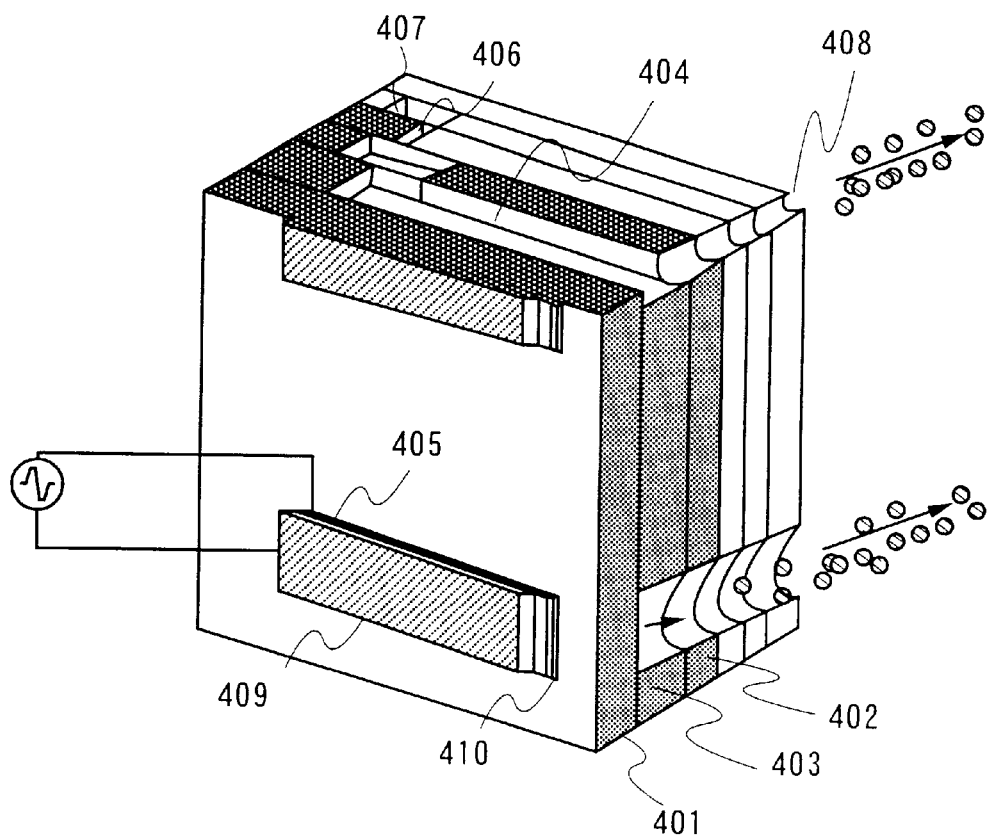
FIG. 4 is a view showing a coating method of an organic EL material of the present invention (Embodiment 2)

Then, in this embodiment, a coating device of the MLChip is shown in FIG. 4. The MLChip is an actuator in which a coating liquid chamber 404 is constituted by a vibrating plate 401 made of ceramic, a communicating plate 402, and a coating liquid chamber plate 403, and a piezo element 405 is formed on the vibrating plate 401 correspondingly to each coating liquid chamber.

Three stainless plates (SUS plates) are stacked on the MLChip, and a supply hole 406, a reservoir 407 and a nozzle 408 are formed as shown in FIG. 4, so that the coating device is formed.

The operation principle of the coating device made of the MLChip is a piezoelectric effect, and a deflection vibration of the piezo element 402 and the vibrating plate 401 by vibration of the piezo element 402 when a voltage is applied to an upper electrode 409 and a lower electrode 410. That is, a pressure is applied to the coating liquid chamber 404 by this deflection, coating liquid contained in the coating liquid chamber is pushed out, and coating is carried out.

The coating liquid discharged from the coating device shown in FIG. 4 is subjected to the electric field control by the method explained in Embodiment 1, so that coating can be selectively carried out to a desired position on the substrate. Besides, the structure of this embodiment can be freely combined with the structure of the Embodiment Modes 1 to 3.

Embodiment 3

In Embodiment 1, although the example has been given, in which the coating position is controlled by one electric field control means, this embodiment shows an example in which another electric field control means is provided between the mask and the substrate in order to further improve the controllability of the coating position than the structure shown in Embodiment 1. FIG. 2A is a view schematically showing the example using a plurality of masks.

In FIG. 2A, reference numeral 1010 designates the substrate; and 1011 is the coating liquid chamber. The coating liquid chamber 1011 contains the coating liquid. Here, the example in which an organic EL material as a polymer is dissolved in a solvent and is coated, is shown.

The coating liquid in the coating liquid chamber 1011 is atomized by the ultrasonic vibrator 1012 and is discharged. The discharged coating liquid passes through the gaps of the first mask 1013 made of conductive material, and after passing through the gaps of the second mask 1019a, the coating liquid is coated on the pixel electrodes on the substrate 1010.

When the coating liquid passes through the first mask 1013, as shown in FIG. 2B of the enlarged view of the portion 1017, the flying direction is controlled by the first mask. The first mask 1013 is structured such that the portions of the first blocking portions 1018 are a plurality of conductive lines each made of conductive material such as platinum (Pt), gold (Au), copper, iron, aluminum, tantalum, titanium, or tungsten and arranged in parallel with each other (stripe shape), or are a net-shaped structure (mesh shape). Further, when the coating liquid having passed through the first mask 1013 passes through the second blocking portions 1019b, as shown in FIG. 2B of the enlarged view of the portion 1017, the flying direction is controlled. Accordingly, the coating liquid is controlled by the first voltage (set by the first power supply 1020) applied to the first blocking portions 1018 and the second voltage (set by the second power supply 1021) applied to the second blocking portions 1019b, passes through the gaps between the first blocking portions 1018 and between the second blocking portions 1019b, and is coated on the substrate. The second mask 1019a has the second blocking portions 1019b which are conductive lines each made of conductive material such as platinum (Pt), gold (Au), copper, iron, aluminum, tantalum, titanium, or tungsten, has a net-like structure made of the conductive lines, has a plate-like structure made of conductive material, or has a structure in which a plurality of conductive lines are arranged in parallel with each other.

Note that the distance between the first mask 1013 and the second mask 1019a, the distance between the second mask 1019a and the substrate, the distance between the respective first blocking portions 1018, the distance between the respective second blocking portions 1019b, and the like may be suitably set by an operator. For example, the distance between the respective first blocking portions 1018 or the distance between the respective second blocking portions 1019b may be made the pixel pitch of the pixel electrodes formed over the substrate.

Note that the voltage (set by the first power supply 1020) is applied to the first blocking portions 1018 of the first mask 1013 to produce such a potential that the atomized coating liquid and the first blocking portions 1018 of the first mask 1013 repel each other. Also, the voltage (set by the second power supply 1021) is applied to the second blocking portions 1019b of the second mask 1019a to produce such a potential that the atomized coating liquid and the second blocking portions 1019b repel each other. Accordingly, the coating liquid can pass through the gaps between the first blocking portions 1018 of the first mask 1013 and the gaps between the second blocking portions 1019b.

The coating position can be controlled with high accuracy by making the structure as shown in FIG. 2A and by suitably adjusting the voltage applied to the first blocking portions 1018 and the voltage applied to the second blocking portions 1019b.

Further, in this embodiment, an electric filed may be applied such that a voltage is previously applied to the pixel electrodes (anodes) formed over the substrate 1010, and the coating liquid having passed through the mask is further controlled to be selectively coated on the desired position.

Besides, the structure of this embodiment can be freely combined with the structure of Embodiment 1 or Embodiment 2.

Embodiment 4

Embodiment 1 uses the coating method of the type in which the coating liquid atomized by the ultrasonic vibrator in the coating liquid chamber is extracted by the external electrode. However, since the atomized coating liquid has a large particle size at the time of coating, there is a defect that the controllability of a coating position is poor.

Then, in this embodiment, coating liquid is charged and is extracted as charged particles, and the respective charged particles are controlled by an electric field, so that the controllability of a coating position can be raised.

Figure 5A:
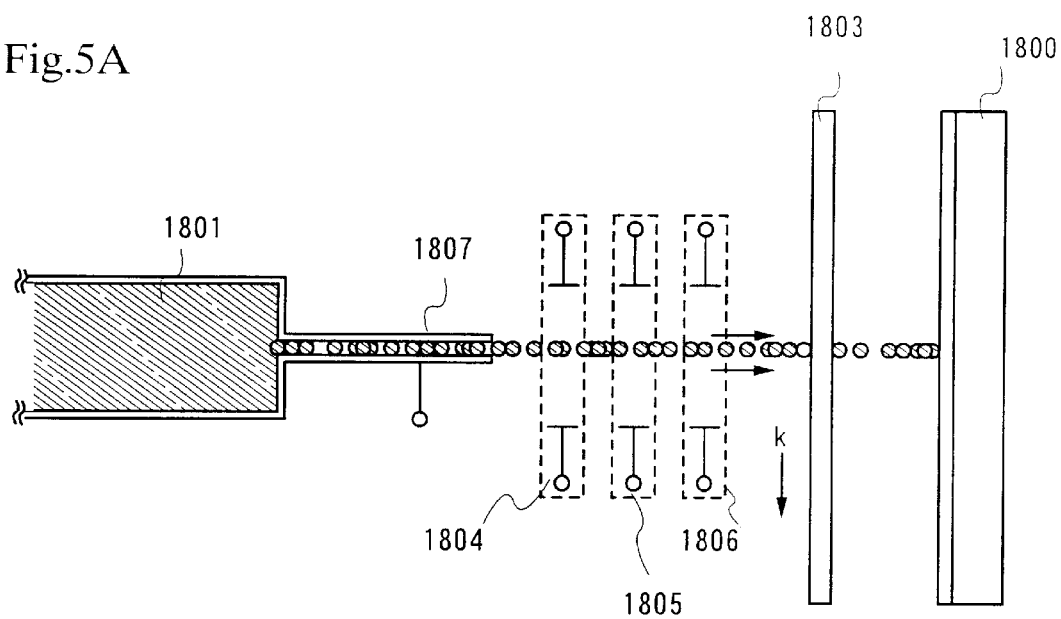
FIGS. 5A and 5B are views showing a coating method of an organic EL material of the present invention.
Figure 5B:
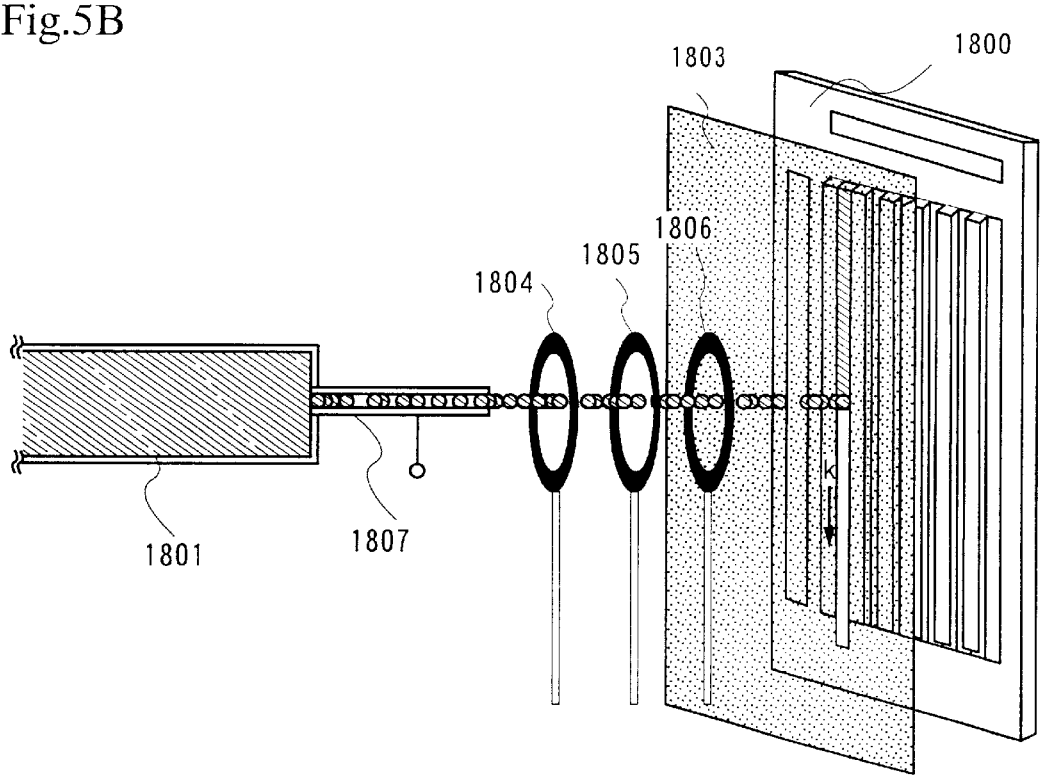

An example of a coating method in this embodiment is shown in FIGS. 5A and 5B. FIG. 5A is a sectional view and FIG. 5B is a perspective view.

A coating liquid chamber 1801 contains coating liquid for an EL layer. Note that, in this embodiment, as an organic EL material, cyanopolyphenylenevinylene is used for a red EL layer, polyphenylenevinylene is used for an EL layer emitting green light, and polyalkylphenylene is used for an EL layer emitting blue light. As a solvent, ethanol or N-methylpyrrolidone is used.

The coating liquid chamber 1801 is provided with a conductive nozzle 1807, and the organic EL material in the coating liquid is charged to form charged particles by applying a voltage to the nozzle 1807. At this time, when a voltage is applied to an extracting electrode 1804, the coating liquid is extracted as the charged particles from the nozzle 1807.

Note that, in order to facilitate the extraction of the coating liquid as the charged particles, it is appropriate that the coating liquid is formed by using a solvent having high conductivity. As the solvent having high conductivity, it is appropriate that a solvent having specific electric conductivity of $1\times10^{-6}$ to $1\times10^{-12} \Omega^{-1} cm^{-1}$ is used.

Further, the coating liquid extracted by the extracting electrode 1804 is accelerated by an acceleration electrode 1805 in the direction of extraction (direction from the nozzle 1807 to a substrate 1800), the flow of the coating liquid is controlled by a control electrode 1806, and when the coating liquid reaches a mask 1803, it is further accelerated by a voltage applied to the mask 1803, and can be finally coated on a pixel portion on the substrate 1800.

In this embodiment, after the coating liquid is extracted from the nozzle 1807 by the extracting electrode 1804, although the coating liquid is suitably coated on the pixel over the substrate 1800 by the acceleration electrode 1805 and the control electrode 1806, it is not always necessary that the number of electrodes is three, but it is sufficient if at least one electrode is provided.

Besides, the structure of this embodiment can be freely combined with any structure of Embodiments 1 to 3.

Embodiment 5

Figure 6:
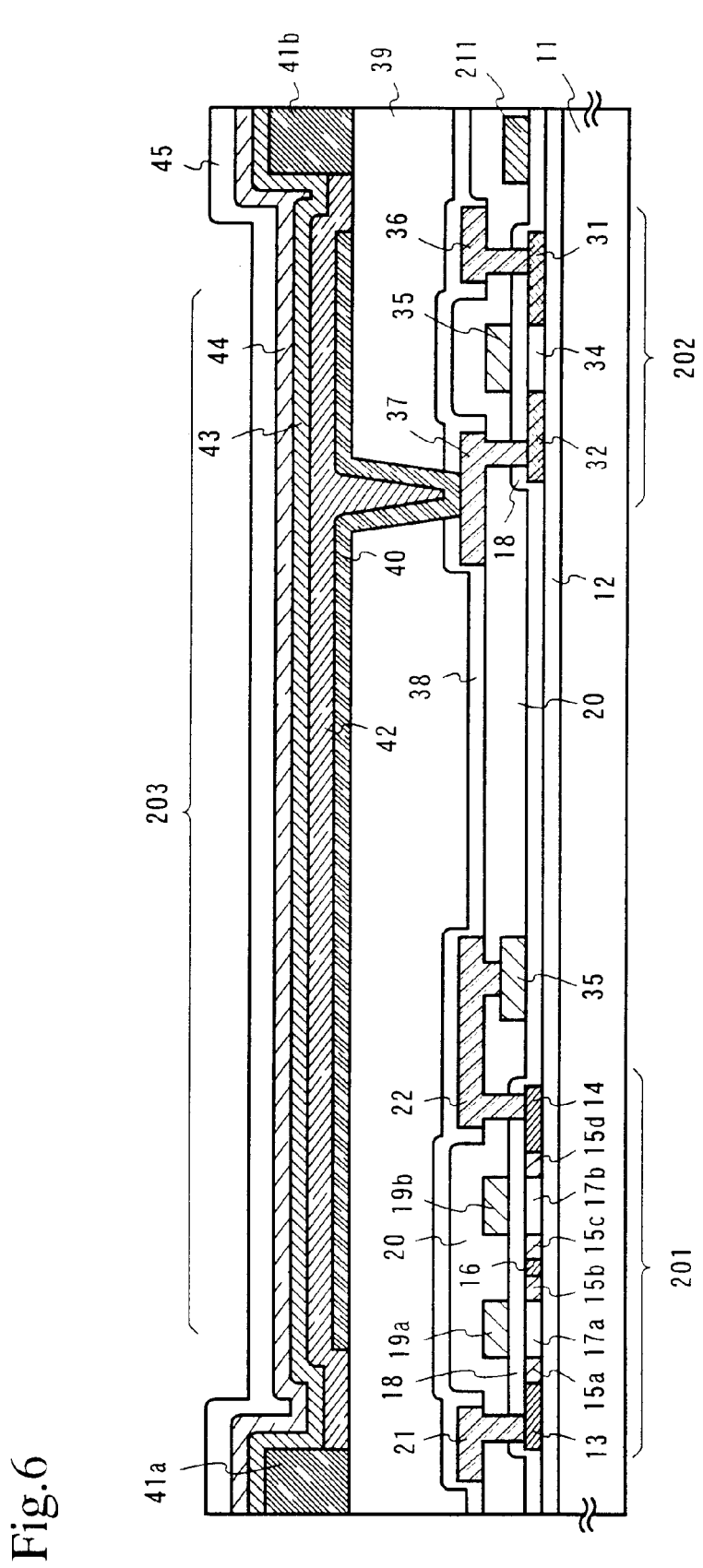
FIG. 6 is a view showing a sectional structure of a pixel portion.
Figure 7A:
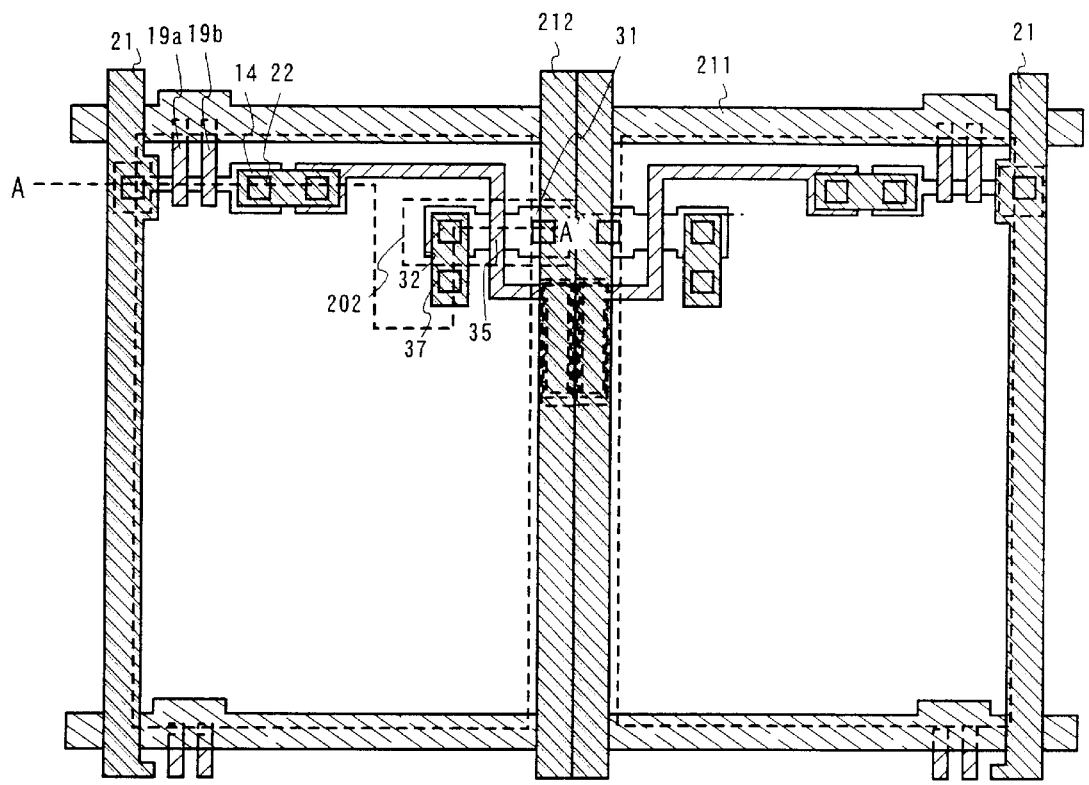
FIGS. 7A and 7B are views showing an upper structure of the pixel portion and its constitution.
Figure 7B:
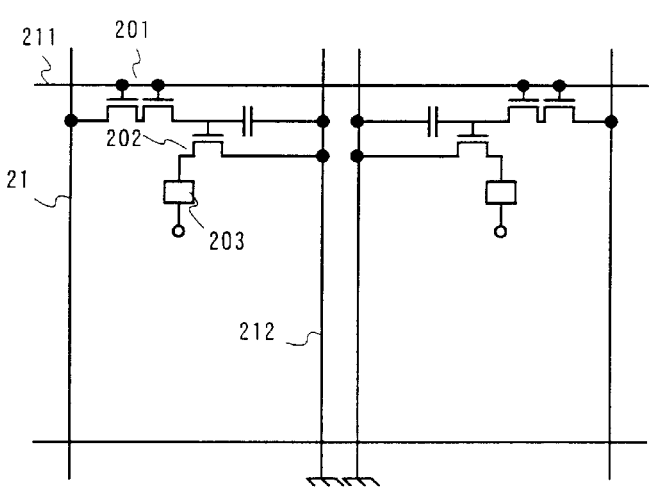

FIG. 6 is a sectional view of a pixel portion of an EL display device of the present invention, FIG. 7A is a top view thereof, and FIG. 7B is a view showing its circuit structure. Actually, pixels are arranged in a matrix form to form a pixel portion (image display portion). Incidentally, a sectional view taken along A—A' of FIG. 7A corresponds to FIG. 6. Thus, since common numerals are used in FIG. 6 and FIGS. 7A and 7B, reference may be suitably made to the both drawings. Although the top view of FIG. 7 shows two pixels, both have the same structure.

In FIG. 6, reference numeral 11 designates a substrate; and 12, an insulating film (hereinafter referred to as an under film) which becomes an under layer. As the substrate 11, a substrate made of glass, glass ceramic, quartz, silicon, ceramic, metal or plastic can be used.

Although the under film 12 is effective especially in the case where a substrate including a movable ion or a conductive substrate is used, it is not necessary to provide the under film on a quartz substrate. As the under film 12, an insulating film containing silicon may be used. In the present specification, the "insulating film containing silicon" indicates an insulating film containing silicon, oxygen, or nitrogen at a predetermined ratio, such as a silicon oxide film, a silicon nitride film, or a silicon nitride oxide film (expressed by SiOxNy).

To dissipate heat of a TFT by making the under film 12 have a heat radiation effect is effective also in preventing deterioration of the TFT or deterioration of the EL element. Any well-known materials can be used for providing the heat radiation effect.

Here, two TFTs are formed in a pixel. Reference numeral 201 designates a switching TFT which is formed of an n-channel TFT; and 202, a current controlling TFT which is formed of a p-channel TFT.

However, in the present invention, it is not necessary that the switching TFT is limited to the n-channel TFT and the current controlling TFT is limited to the p-channel TFT, but a modification can be made such that the switching TFT is made the p-channel TFT and the current controlling TFT is made the n-channel TFT, or both use the n-channel TFTs or the p-channel TFTs.

The switching TFT 201 includes a source region 13, a drain region 14, LDD region 15a to 15d, an active layer including a high concentration impurity region 16 and channel formation regions 17a and 17b, a gate insulating film 18, gate electrodes 19a and 19b, a first interlayer insulating film 20, a source wiring 21, and a drain wiring 22.

Besides, as shown in FIGS. 7A and 7B, the gate electrodes 19a and 19b have a double gate structure in which they are electrically connected to a gate wiring 211 formed of another material (material having resistance lower than the gate electrodes 19a and 19b). Of course, not only the double gate structure, but also a single gate or a so-called multigate structure (structure including an active layer having at least two channel formation regions connected in series) such as a triple gate structure may be adopted. The multigate structure is very effective in decreasing an off current value, and in the present invention, the switching element 201 of the pixel is made the multigate structure so that the switching element having a low off current value is realized.

The active layer is formed of a semiconductor film containing a crystalline structure. That is, a single crystal semiconductor film may be used, a polycrystalline semiconductor film or a microcrystalline semiconductor film may be used. The gate insulating film 18 may be formed of an insulating film containing silicon. Any conductive film may be used for the gate electrode, the source wiring or the drain wiring.

Further, in the switching TFT 201, the LDD regions 15a to 15d are provided not to overlap with the gate electrodes 19a and 19b through the gate insulating film 18. This sort of structure is very effective in decreasing the off current value.

Note that it is further preferable to provide an offset region (region made of a semiconductor layer of the same composition as the channel formation region and a gate voltage is not applied) between the channel formation region and the LDD region, in view of decreasing the off current value. In the case of the multigate structure having at least two gate electrodes, the high concentration impurity region provided between the channel formation regions is effective in decreasing the off current value.

Next, the current controlling TFT 202 includes an active layer including a source region 31, a drain region 32 and a channel formation region 34, a gate insulating film 18, a gate electrode 35, a first interlayer insulating film 20, a source wiring 36, and a drain wiring 37. Although the gate electrode 35 has a single gate structure, a multigate structure may be adopted.

As shown in FIG. 7, the drain of the switching TFT is connected to the gate of the current controlling TFT 202. Specifically, the gate electrode 35 of the current controlling TFT 202 is electrically connected to the drain region 14 of the switching TFT 201 through the drain wiring (which can also be called a connection wiring) 22. The source wiring 36 is connected to a power supply line 212.

The current controlling TFT 202 is an element for controlling the quantity of current injected to an EL element 203, and it is not preferable to cause a large amount of current to flow in view of deterioration of the EL element. Thus, it is preferable to design a channel length (L) to be sufficiently long so that excessive current does not flow through the current controlling TFT 202. It is designed to desirably make the current 0.5 to 2 $\mu$A per pixel (preferably 1 to 1.5 $\mu$A).

The length (width) of the LDD region formed in the switching TFT 201 is made 0.5 to 3.5 82 m, typically 2.0 to 2.5 $\mu$m.

Figure 16:
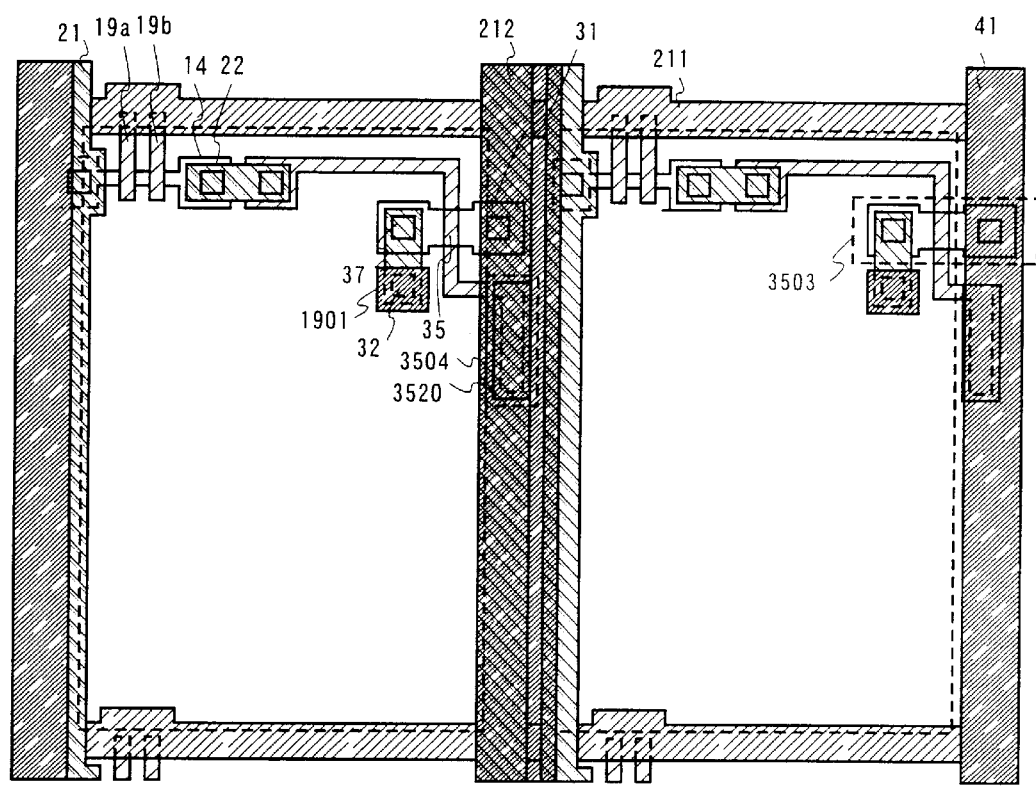
FIG. 16 is a view showing an upper structure of a pixel portion.

Besides, as shown in FIGS. 16, the wiring including the gate electrode 35 of the current controlling TFT 3503 overlaps with the power supply line 211 of the current controlling TFT 3503 at a region designated by 3504 through the insulating film. At this time, a holding capacitance (capacitor) is formed in a region designated by 3504. Concerning the holding capacitance 3504, a capacitance formed by the semiconductor film 3520 the insulating film (not shown) of the same layer as the gate insulating film, and the power supply line 211 can also be used as the holding capacitance.

This holding capacitance 3504 functions as a capacitor for holding voltage applied to the gate electrode 35 of the current controlling TFT 3503.

From the viewpoint of increasing the quantity of current which can flow, it is also effective to increase the thickness (preferably 50 to 100 nm, more preferably 60 to 80 nm) of the active layer (especially the channel formation region) of the current controlling TFT 202. On the contrary, in the case of the switching TFT 201, from the viewpoint of decreasing the off current value, it is also effective to decrease the thickness (preferably 20 to 50 nm, more preferably 25 to 40 nm) of the active layer (especially the channel formation region).

Next, reference numeral 38 designates a first passivation film, and it is appropriate that its film thickness is made 10 nm to 10 μm (preferably 200 to 500 nm). As its material, an insulating film containing silicon (especially a silicon nitride oxide film or a silicon nitride film is preferable) can be used.

A second interlayer insulating film (which may be called a flattening film) 39 is formed on the first passivation film 38 to cover the respective TFTs, so that a step formed by the TFTs is flattened. As the second interlayer insulating film 39, an organic resin film is preferable, and it is preferable to use polyimide, polyamide, acrylic resin, BCB (benzocyclobutene) or the like. Of course, if sufficient flattening can be made, an inorganic film may be used.

It is very important to flatten the step, which is produced by the TFT, through the second interlayer insulating film 39. Since an EL layer formed later is very thin, there is a case where poor luminescence occurs due to existence of a step. Accordingly, it is desirable to make flattening before a pixel electrode is formed, so that the EL layer can be formed on the flattest surface as much as possible.

Reference numeral 40 designates a pixel electrode (corresponding to an anode of the EL element) made of a transparent conductive film, and after a contact hole (opening) is formed in the second interlayer insulating film 39 and the first passivation film 38, the pixel electrode is formed to be connected to the drain wiring 37 of the current controlling TFT 202 at the formed opening portion.

In this embodiment, a conductive film made of a compound of indium oxide and tin oxide is used as the pixel electrode. Besides, a small amount of gallium may be added to this. Further, a compound of indium oxide and zinc oxide or a compound of zinc oxide and gallium oxide can also be used. Note that a recess produced after a pixel electrode is formed on a contact hole is called an electrode hole in this specification.

After the pixel electrode is formed, banks 41a and 41b made of resin material are formed. The banks 41a and 41b are formed by patterning an acrylic resin film or a polyimide film having a thickness of 1 to 2 μm. The banks 41a and 41b are respectively formed like a stripe between a pixel and a pixel. In this embodiment, although they are formed along the source wiring 21, they may be formed along the gate wiring 35.

Next, in this embodiment, an EL layer 42 is formed with a thin film forming method as explained in FIG. 1. Although only one pixel is shown here, EL layers corresponding to the respective colors of R (red), G (green) and B (blue) are formed as explained in Embodiment 1.

First, coating liquid contained in the coating liquid chamber is atomized by the ultrasonic vibrator 112 and is discharged, and after passing through the mask to which voltage is applied, the discharged coating liquid is coated on the pixel portion on the substrate 110.

When the coating liquid passes through the mask 113, the flying direction is controlled by the electric field near the mask. It is appropriate that a voltage of several tens of V to 10 kV is applied to the mask 113, and preferably a voltage of 10 V to 1 kV is applied.

In this embodiment, first, coating liquid for a red EL layer contained in the coating liquid chamber is discharged, and the substrate 110 is moved in the vertical direction, so that a pixel array emitting red light is formed on pixels. Next, after the mask is moved in the horizontal direction, coating liquid for a green EL layer contained in the coating liquid chamber is discharged, and coating is made while the substrate 110 is moved in the vertical direction, so that a pixel array to emit green light is formed. Further, the mask is moved in the horizontal direction, coating liquid for a blue EL layer contained in the coating liquid chamber is discharged, and the substrate 110 is moved in the vertical direction, so that a pixel array to emit blue light is formed.

Note that the coating liquid chamber 111 containing the coating liquid may be changed together when kind of the coating liquid is changed, or the coating liquid chamber is not changed but only the coating liquid may be exchanged.

Besides, although the coating liquid chamber 111 and the mask 113 explained here may be separately provided, they may be integrally formed to be made into one device.

As described above, by coating the pixel arrays to emit red, green and blue lights three times for the respective colors while the mask is moved, the three-color stripe-shaped EL layers (strictly speaking, precursors of the EL layers) are formed. Besides, the three-color EL layers may be formed at the same time.

As the organic EL material used for the EL layer, a polymer material is used. As a typical polymer material, polyparaphenylene vinylene (PPV), polyvinylcarbazole (PVK), polyfluorene or the like is named.

Although there are various types as the PPV organic EL material, for example, the following molecular formula is published ("H. Shenk, H. Becker, O. Gelsen, E. Kluge, W. Kreuder, and H. Spreitzer, "Polymers for Light Emitting Diodes", Euro Display, Proceedings, 1999, p. 33–37").

Chemical Formula 1
Chemical Formula 2

Besides, polyphenylvinyl of a molecular formula disclosed in Japanese Patent Application Laid-open No. Hei. 10-92576 can also be used. The molecular formula is as follows:

Chemical Formula 3
Chemical Formula 4

Besides, as the PVK organic EL material, there is a molecular formula as follows:

Chemical Formula 5

The polymer (high molecular) organic EL material can be dissolved in a solvent when it is in a state of polymer and can be coated, or can be dissolved in a solvent when it is in a state of monomer and can be polymerized after coating. In the case where it is coated in the state of monomer, a polymer precursor is first formed and is polymerized by heating in vacuum so that a polymer is formed.

As a specific EL layer, it is appropriate that cyanopolyphenylenevinylene is used for the EL layer emitting red light, polyphenylenevinylene is used for the EL layer emitting green light, and polyphenylenevinylene or polyalkylphenylene is used for the EL layer emitting blue light. It is appropriate that its thickness is made 30 to 150 nm (preferably 40 to 100 nm).

However, the above examples are merely examples of the organic EL material which can be used as the EL layer of the present invention, and it is not necessary to limit the material to these. In this embodiment, the mixture of the organic EL material and the solvent is coated with the system shown in FIGS. 1A to 1C, and the solvent is volatilized to remove, so that the EL layer is formed. Accordingly, as long as the combination is such that the temperature when the solvent is volatilized does not exceed the glass transition temperature of the EL layer, any organic EL material may be used.

Further, the EL layer may be formed of a low molecular EL material, such as tris (8-quinolinonato) aluminum complex (Alq) or bis (benzoquinolinolato) beryllium complex (BeBq), using an evaporation method, or may be formed using the low molecular material together with a high molecular organic EL material.

As a typical solvent, there is named ethanol, xylene, chlorobenzene, dichlorobenzene, anisole, chloroform, dichloromethane, a-butyllactone, butyl cellosolve, cyclohexane, NMP (N-methyl-2-pyrrolidone), cyclohexanone, dioxane, or THF (tetrahydrofuran).

Further, when the EL layer 42 is formed, since the EL layer is easily deteriorated by the existence of moisture or oxygen, it is desirable that a atmosphere for treatment is made an atmosphere with little moisture and oxygen, and the treatment is carried out in an inert gas such as nitrogen or argon. Further, it is also appropriate that treatment is carried out under the atmosphere with the solvent used for preparation of the coating liquid since the evaporation speed of the coating liquid can be controlled. Note that, in order to carry out these, it is desirable that formation of the thin film as the EL layer shown in FIGS. 1A to 1C is carried out in a clean booth filled with the inert gas.

After the EL layer 42 is formed following the manner as described above, a cathode 43 made of a light shielding conductive film, a protective electrode 44, and a second passivation film 45 are next formed. In this embodiment, a conductive film made of MgAg is used as the cathode 43, and a conductive film made of aluminum is used as the protective electrode 44. Further, a silicon nitride film having a thickness of 10 nm to 10 $\mu$m (preferably 200 to 500 nm) is used as the second passivation film 45.

Note that, since the EL layer is weak against heat as described above, it is desirable that the cathode 43 and the second passivation film 45 are formed at a temperature as low as possible (preferably in the temperature range of from room temperature to 120° C.). Accordingly, a plasma CVD method, a vacuum evaporation method or a solution coating method (spin coating method) is a desirable film forming method.

What is completed up to this state is called an active matrix substrate, and an opposite substrate (not shown) is provided opposite to the active matrix substrate. In this embodiment, a glass substrate is used as the opposite substrate. Note that, as the opposite substrate, a substrate made of plastic or ceramic may be used.

Besides, the active matrix substrate and the opposite substrate are bonded to each other by a sealing agent (not shown), and a sealed space (not shown) is formed. In this embodiment, the sealed space is filled with an argon gas. Of course, it is also possible to dispose a drying agent such as barium oxide or anti-oxidizing agent in this sealed space.

Further, the structure of this embodiment can be freely combined with any structure of Embodiments 1 to 4.

Embodiment 6

A method of fabricating a pixel portion as set forth in the above respective embodiments and TFTs of a driver circuit portion provided at its periphery will be described with reference to FIGS. 8A to 10C. However, for simplification of the explanation, with respect to a driver circuit, a CMOS circuit as a basic circuit is shown.

First, as shown in FIG. 8A, an under film 301 having a thickness of 300 nm is formed on a glass substrate 300. In this embodiment, as the under film 301, a laminate of a silicon nitride oxide film having a thickness of 100 nm and a silicon nitride oxide film having a thickness of 200 nm is used. At this time, it is appropriate that the concentration of nitrogen of the film in contact with the glass substrate 300 is made 10 to 25 wt %. Of course, a component may be formed on a quartz substrate without providing the under film.

Next, an amorphous silicon film (not shown) having a thickness of 50 nm is formed on the under film 301 by a well-known film forming method. Note that it is not necessary to limit the film to the amorphous silicon film, but a semiconductor film (including a microcrystalline semiconductor film) containing an amorphous structure may be used. Further, a compound semiconductor film containing an amorphous structure, such as an amorphous silicon germanium film, may be used. Further, the film thickness may be 20 to 100 nm.

Then, the amorphous silicon film is crystallized by a well-known technique so that a crystalline silicon film (also called a polycrystalline silicon film or a polysilicon film) 302 is formed. As the well-known crystallizing methods, there is a thermal crystallizing method using an electric heating furnace, a laser anneal crystallizing method using laser light, or a lamp anneal crystallizing method using infrared light. In this embodiment, crystallization is made by use of excimer laser light using a XeCl gas.

Note that, in this embodiment, although a pulse oscillation type excimer laser light formed into a linear shape is used, a rectangular light may be used, or a continuous-wave argon laser light or a continuous-wave excimer laser light can also be used.

In this embodiment, although the crystalline silicon film is used as an active layer of a TFT, an amorphous silicon film can also be used. Besides, it is also possible to form an active layer of a switching TFT, which is required to decrease an off current, by an amorphous silicon film, and to form an active layer of a current controlling TFT by a crystalline silicon film. Since the amorphous silicon film has low carrier mobility, it is hard to cause the current to flow and the off current does not easily flow. That is, it is possible to use merits of both of the amorphous silicon film in which the current does no easily flow and the crystalline silicon film in which the current easily flows.

Next, as shown in FIG. 8B, a protective film 303 made of a silicon oxide film and having a thickness of 130 nm is formed on the crystalline silicon film 302. The thickness may be selected within the range of 100 to 200 nm (preferably 130 to 170 nm). As long as an insulating film contains silicon, another film may be used. This protective film 303 is provided to prevent the crystalline silicon film from being directly exposed to plasma when an impurity is added and to enable delicate concentration control.

Then, resist masks 304a and 304b are formed thereon, and an impurity element (hereinafter referred to as an n-type impurity element) for giving an n type is added through the protective film 303. Note that, as the n-type impurity element, representatively an element belonging to group 15, and typically phosphorus or arsenic can be used. Note that this embodiment uses a plasma (ion) doping method in which phosphine (PH$_3$) is plasma excited without mass separation, and phosphorus of a concentration of 1×10$^{18}$ atoms/cm$^3$ is added. Of course, an ion implantation method in which mass separation is carried out may be used.

A dosage is adjusted so that the n-type impurity element of a concentration of 2×10$^{16}$ to 5×10$^{19}$ atoms/cm$^3$ (typically 5×10$^{17}$ to 5×10$^{18}$ atoms/cm$^3$) is contained in an n-type impurity region 305 formed in this step.

Next, as shown in FIG. 8C, the protective film 303 and the resist masks 304a and 304b are removed, and the added element belonging to group 15 is activated. Although a well-known technique may be used as an activation means, in this embodiment, activation is made by irradiation of excimer laser light. Of course, both a pulse oscillation type and a continuous-wave type may be used, and it is not necessary to make a limitation to the excimer laser light. However, since the activation of the added impurity element is an object, it is preferable to make irradiation with an energy at such a level that the crystalline silicon film does not melt. Note that the laser light may be irradiated while the protective film 303 is provided.

Note that, when the impurity element is activated by the laser light, activation by a heat treatment may be simultaneously used. In the case where the activation by the heat treatment is carried out, it is appropriate that the heat treatment of about 450 to 550° C. is carried out in view of heat resistance of the substrate.

By this step, an end portion of the n-type impurity region 305, that is, a boundary portion (junction portion) between the n-type impurity region 305 and a region existing around it and added with no n-type impurity element becomes definite. This means that at the point of time when a TFT is completed later, an LDD region and a channel formation region can form an excellent junction portion.

Next, as shown in FIG. 8D, an unnecessary portion of the crystalline silicon film is removed, and island-like semiconductor films (hereinafter referred to as active layers) 306 to 309 are formed.

Next, as shown in FIG. 8E, a gate insulating film 310 covering the active layers 306 to 309 is formed. As the gate insulating film 310, it is appropriate that an insulating film having a thickness of 10 to 200 nm, preferably 50 to 150 nm and containing silicon is used. This may have a single layer structure or a laminate structure. In this embodiment, a silicon nitride oxide film having a thickness of 110 nm is used.

Next, a conductive film having a thickness of 200 to 400 nm is formed, and is patterned so that gate electrodes 311 to 315 are formed. The end portion of each of the gate electrodes 311 to 315 may be made taper-shaped. Note that, in this embodiment, the gate electrode and a wiring (hereinafter referred to as a gate wiring) electrically connected to the gate electrode and for leading are formed of different materials. Specifically, a material having resistance lower than the gate electrode is used for the gate wiring. This structure is adopted to use a material enabling fine working for the gate electrode and to use a material, which has low wiring resistance though fine working can not be made for the gate wiring. Of course, the gate electrode and the gate wiring may be made of the same material.

Although the gate electrode may be formed of a single layer conductive film, it is preferable to make a laminate film such as a two-layer film or a three-layer film as the need arises. As the material of the gate electrode, any well-known conductive film can be used. However, it is preferable to use a material in which fine working can be carried out as described above, specifically, patterning can be made to a line width of 2 μm or less.

Typically, a film made of an element selected from tantalum (Ta), titanium (Ti), molybdenum (Mo), tungsten (W), chromium (Cr) and silicon (Si), a nitride film of the element (typically, a tantalum nitride film, a tungsten nitride film, a titanium nitride film), an alloy film of a combination of the elements (typically, Mo—W alloy, Mo—Ta alloy), or a silicide film of the element (typically, a tungsten silicide film, a titanium silicide film) can be used. Of course, both a single layer and a laminate layer may be used.

In this embodiment, a laminate film made of a tantalum nitride (TaN) film having a thickness of 50 nm and a tantalum (Ta) film having a thickness of 350 nm is used. This may be formed by a sputtering method. Besides, when an inert gas such as Xe or Ne is added, film peeling due to stress can be prevented.

At this time, the gate electrode 312 is formed to overlap with a part of the n-type impurity region 305 through the gate insulating film 310. This overlapping portion later becomes an LDD region overlapping with the gate electrode. Note that although the gate electrodes 313 and 314 are seen as two in section, they are actually electrically connected to each other.

Figure 9A:
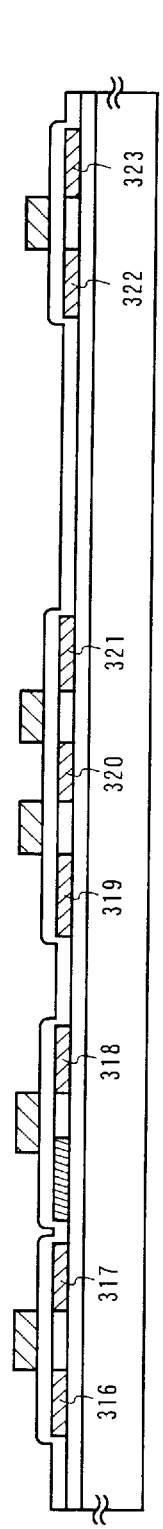
FIGS. 9A to 9D are views showing fabricating steps of the EL display device.

Next, as shown in FIG. 9A, an n-type impurity element (in this embodiment, phosphorus) is added by using the gate electrodes 311 to 315 as masks in a self-aligning manner. Adjustment is made so that phosphorus having a concentration of ½ to ¹⁄₁₀ (typically ⅓ to ¼) of that of the n-type impurity region 305 is added in impurity regions 316 to 323 formed in this way. Specifically, a concentration of $1\times10^{16}$ to $5\times10^{18}$ atoms/cm³ (typically $3\times10^{17}$ to $3\times10^{11}$ atoms/cm³) is preferable.

Figure 9B:
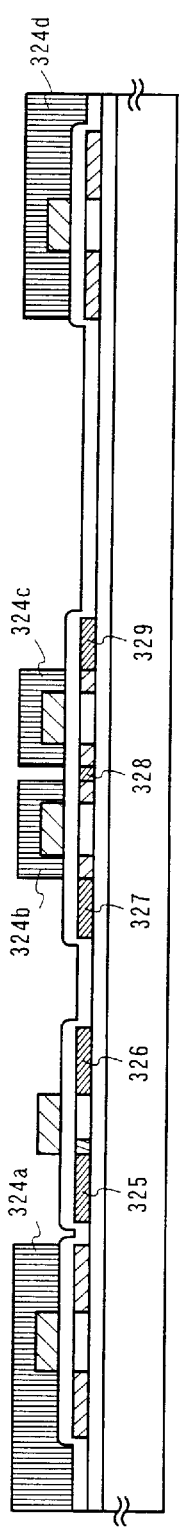

Next, as shown in FIG. 9B, resist masks 324a to 324d are formed to cover the gate electrodes and the like, and an n-type impurity element (in this embodiment, phosphorus) is added to form impurity regions 325 to 329 containing phosphorus of high concentration. Also here, an ion doping method using phosphine ($PH_3$) is used, and adjustment is made so that the concentration of phosphorus of this region becomes $1\times10^{20}$ to $1\times10^{21}$ atoms/cm³ (typically $2\times10^{21}$ to $5\times10^{21}$ atoms/cm³).

By this step, although a source region or a drain region of an n-channel TFT is formed, in the switching TFT, a part of the n-type impurity regions 319 to 321 formed in the step of FIG. 9A are made to remain. The remaining regions correspond to the LDD regions 15a to 15d of the switching TFT 201 in FIG. 6.

Figure 9C:
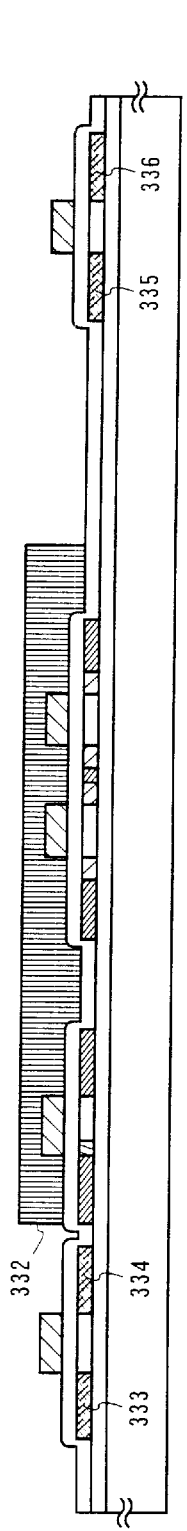

Next, as shown in FIG. 9C, the resist masks 324a to 324d are removed, and a resist mask 332 is newly formed. Then, a p-type impurity element (in this embodiment, boron) is added to form impurity regions 333 to 336 containing boron of high concentration. Here, boron is added by an ion doping method using diborane ($B_2H_6$) to have a concentration of $3\times10^{20}$ to $3\times10^{21}$ (typically $5\times10^{20}$ to $1\times10^{21}$ atoms/cm³).

Although phosphorus of a concentration of $1\times10^{20}$ to $1\times10^{21}$ atoms/cm³ is already added to the impurity regions 333 to 336, boron added here is added at a concentration at least three times higher than that. Thus, the previously formed n-type impurity regions are completely inverted to have a p-type, and functions as p-type impurity regions.

Next, the resist mask 332 is removed, and the n-type and p-type impurity elements added at the respective concentrations are activated. As activation means, a furnace annealing method, a laser annealing method, or a lamp annealing method can be used. In this embodiment, a heat treatment at 550° C. for 4 hours in a nitrogen atmosphere is carried out by an electric heating furnace for example.

At this time, it is important to remove oxygen in the atmosphere to the utmost degree. This is because, if oxygen exists even in a small amount, the surface of the exposed gate electrode is oxidized, so that the resistance is increased and it becomes difficult to realize ohmic contact later. Accordingly, it is desirable that the oxygen concentration in the treatment atmosphere in the activation step is made 1 ppm or less, preferably 0.1 ppm or less.

Figure 9D:
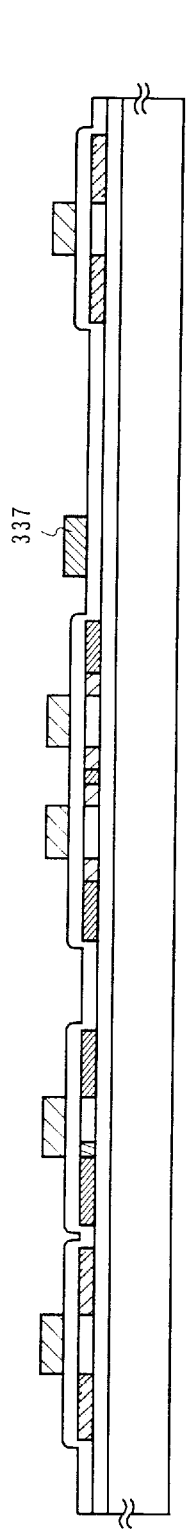

Next, after the activation step is completed, as shown in FIG. 9D, a gate wiring 337 having a thickness of 300 nm is formed. As a material of the gate wiring 337, it is appropriate that metal containing aluminum (Al) or copper (Cu) as its main ingredient (occupying a percentage of 50 to 100% in the composition) is used. As the arrangement, as shown in FIG. 7A, formation is made such that the gate wiring 211 is electrically connected to the gate electrodes 19a and 19b (313 and 314 in FIG. 8E) of the switching TFT.

Since the wiring resistance of the gate wiring can be made very small by having such structure, it is possible to form an image display region (pixel portion) having a large area. That is, the pixel structure of this embodiment is very effective in realizing an EL display device having a screen size of 10 inches or more (further, 30 inches or more) in a diagonal.

Figure 10A:
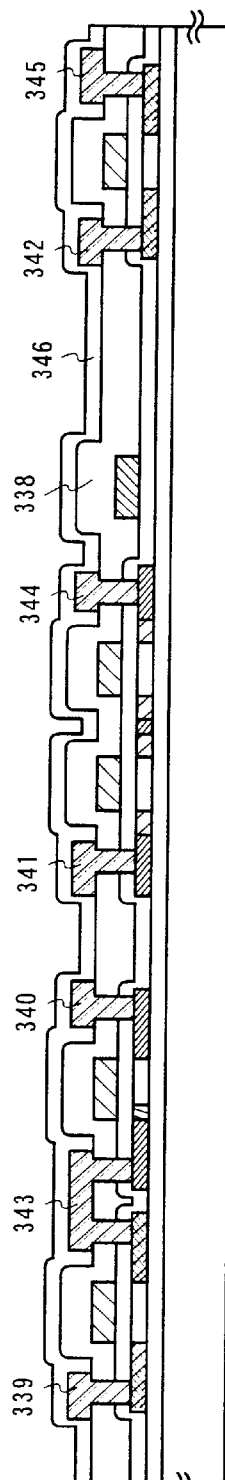
FIGS. 10A to 10C are views showing fabricating steps of the EL display device.

Next, as shown in FIG. 10A, a first interlayer insulating film 338 is formed. As the first interlayer insulating film 338, it is appropriate that an insulating film containing silicon is used as a single layer, or a laminate film in which at least two kinds of insulating films containing silicon are combined is used. Besides, it is appropriate that the film thickness is made 400 nm to 1.5 $\mu$m. This embodiment adopts such a structure that a silicon oxide film having a thickness of 800 nm is laminated on a silicon nitride oxide film having a thickness of 200 nm.

Further, in an atmosphere containing hydrogen of 3 to 100%, a heat treatment is carried out at 300 to 450° C. for 1 to 12 hours, so that a hydrogenating treatment is carried out. This step is a step for causing hydrogen termination of unpaired bond of a semiconductor film by thermally excited hydrogen. As other means for hydrogenating, plasma hydrogenating (using hydrogen generated in plasma) may be carried out.

Note that the hydrogenating treatment may be carried out during the formation of the first interlayer insulating film 338. That is, after the silicon nitride oxide film having a thickness of 200 nm is formed, the hydrogenating treatment is carried out as described above, and thereafter, the remaining silicon oxide film of a thickness of 800 nm may be formed.

Next, contact holes are formed in the first interlayer insulating films 338 and the gate insulating film 310, and source wirings 339 to 342 and drain wirings 343 to 345 are formed. In this embodiment, this electrode is made a laminate film of a three-layer structure in which a Ti film having a thickness of 100 nm, an aluminum film containing Ti and having a thickness of 300 nm, and a Ti film having a thickness of 150 nm are continuously formed by a sputtering method. Of course, other conductive films may be used.

Next, a first passivation film 346 having a thickness of 50 to 500 nm (typically 200 to 300 nm) is formed. In this embodiment, as the first passivation film 346, a silicon nitride oxide film having a thickness of 300 nm is used. This may be replaced by a silicon nitride film.

Note that it is effective to carry out a plasma treatment using a gas containing hydrogen such as $H_2$ or $NH_3$ before the silicon nitride oxide film is formed. Hydrogen excited by this pretreatment is supplied to the first interlayer insulating film 338, and a heat treatment is carried out, so that the film quality of the first passivation film 346 is improved. At the same time, since hydrogen added to the first interlayer insulating film 338 is diffused to the side of a lower layer, it is possible to effectively hydrogenate the active layer.

Figure 10B:
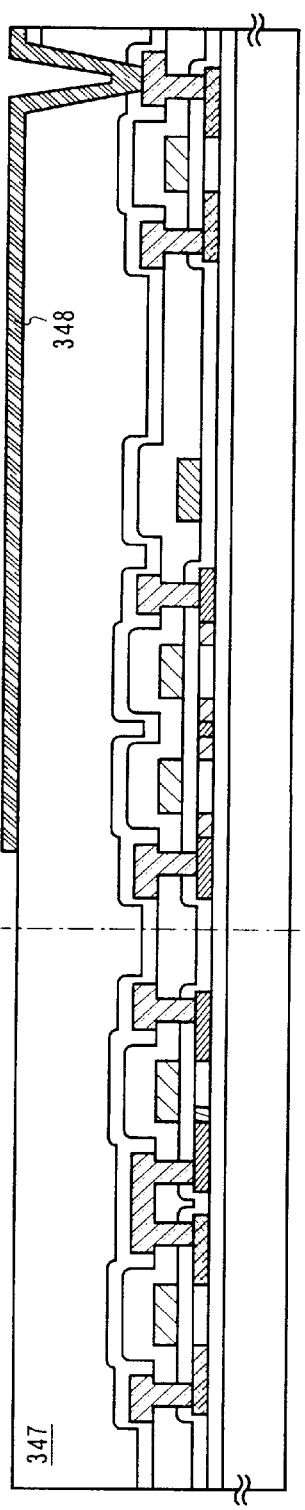

Next, as shown in FIG. 10B, a second interlayer insulating film 347 made of organic resin is formed. As the organic resin, polyimide, polyamide, acrylic resin, BCB (benzocyclobutene) or the like can be used. Especially, the second interlayer insulating film 347 has rather the meaning of flattening, therefore acrylic resin excellent in flatness is preferable. In this embodiment, an acrylic resin film is formed to such a thickness that stepped portions formed by the TFTs can be sufficiently flattened. Preferably, the thickness is made 1 to 5 $\mu$m (more preferably 2 to 4 $\mu$m).

Next, a contact hole is formed in the second interlayer insulating film 347 and the first passivation film 346, and a pixel electrode 348 electrically connected to the drain wiring 345 is formed. In this embodiment, an indium-tin oxide (ITO) film is formed to a thickness of 110 nm, and patterning is made to form a pixel electrode. Besides, a compound in which zinc oxide (ZnO) of 2 to 20% is mixed with indium oxide, or a compound made of zinc oxide and gallium oxide may be used as a transparent electrode. This pixel electrode becomes an anode of an EL element.

Figure 10C:
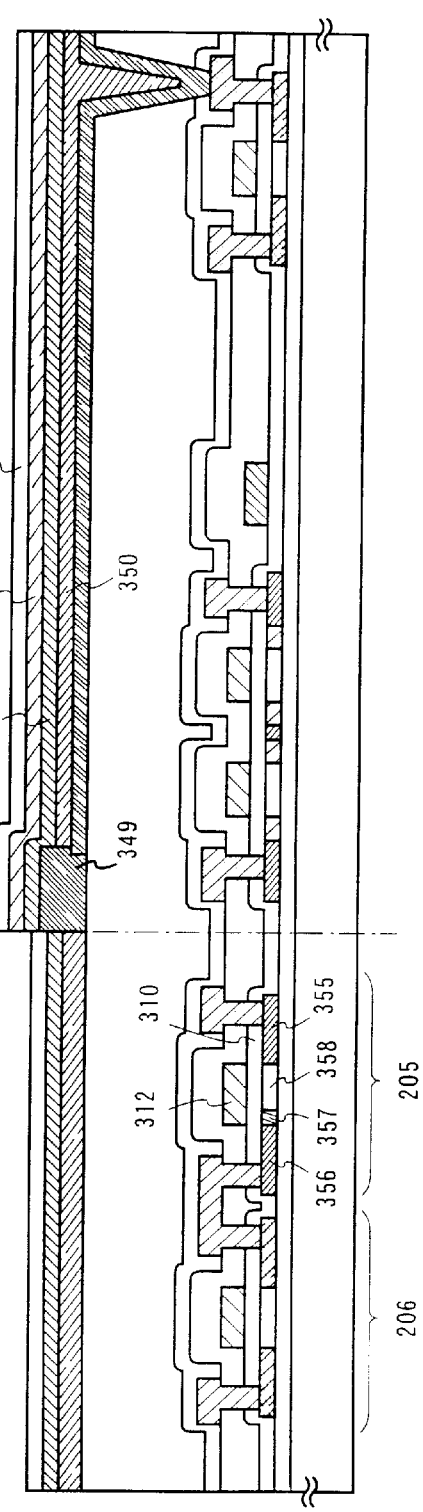

Next, as shown in FIG. 10C, a bank 349 made of resin material is formed. The bank 349 may be made by patterning an acrylic resin film or a polyimide film having a thickness of 1 to 2 $\mu$m. As shown in FIG. 6, the bank 349 is formed into a stripe shape between a pixel and a pixel. In this embodiment, although it is formed along the source wiring 341, it may be formed along the gate wiring 337.

Next, an EL layer 350 is formed by the thin film forming method explained in FIG. 1. Note that, although only one pixel is shown here, as explained in FIG. 1, EL layers corresponding to the respective colors of R (red), G (green) and B (blue) are formed.

First, a coating liquid contained in the coating liquid chamber is atomized by the ultrasonic vibrator 112 and is discharged, and after passing through the mask to which a voltage is applied, the discharged coating liquid is coated on the pixel portion on the substrate 110.

When the coating liquid passes through the mask 113, the flying direction is controlled by an electric field near the mask.

In the present invention, first, a red layer coating liquid is discharged from the coating liquid chamber, and the substrate is moved in the vertical direction, so that a pixel array to emit red light is formed on the pixel. Next, after the mask is moved in the horizontal direction, a green EL layer coating liquid is coated from the coating liquid chamber while the substrate is moved in the vertical direction, so that a pixel array to emit green light is formed. Further, the mask is moved in the horizontal direction, and a blue EL layer coating liquid is coated from the coating liquid chamber while the substrate is moved in the vertical direction, so that a pixel array to emit blue light is formed.

As described above, by coating the pixel arrays to emit red, green and blue lights three times for the respective colors while the mask is moved, the three-color stripe-shaped EL layers (strictly speaking, precursors of EL layers) are formed. Besides, three-color EL layers may be formed at the same time.

Specifically, an organic EL material which becomes the EL layer 350 is dissolved in a solvent such as chloroform, dichloromethane, xylene, ethanol, tetrahydrofuran, or N-methylpyrrolidone, and thereafter, a heat treatment is carried out to volatilize the solvent. In this way, the coating film (EL layer) made of the organic EL material is formed.

Note that, although only one pixel is shown in this embodiment, EL layers emitting lights of the same color are formed at the same time.

Note that cyanopolyphenylenevinylene is used for the EL layer emitting red light, polyphenylenevinylene is used for the EL layer emitting green light, and polyalkylphenylene is used for the EL layer emitting blue light. Each of the layers is formed to a thickness of 50 nm. As the solvent, 1,2-dichloromethane is used, and a heat treatment for 1 to 5 minutes is carried out by a hot plate of 80 to 150° C. to volatilize the solvent.

As the EL layer 350, a well-known material can be used. As the well-known material, in view of a driving voltage, it is preferable to use organic material. Note that, in this embodiment, although the EL layer 350 is made a single layer structure of only the EL layer, as the need arises, an electron injecting layer, an electron transporting layer, a hole transporting layer, a hole injecting layer, an electron blocking layer, or a hole blocking layer may be provided. Besides, although this embodiment shows an example in which a MgAg electrode is used as a cathode 351 of the EL element, other well-known materials may be used.

After the EL layer 350 is formed, the cathode (MgAg electrode) 351 is formed by using a vacuum evaporation method. Note that it is appropriate that the thickness of the EL layer 350 is made 80 to 200 nm (typically 100 to 120 nm), and the thickness of the cathode 351 is made 180 to 300 nm (typically 200 to 250 nm).

Further, a protective electrode 352 is provided on the cathode 351. As the protective electrode 352, a conductive film containing aluminum as its main ingredient may be used. The protective electrode 352 may be formed by a vacuum evaporation method using a mask.

Finally, a second passivation film 353 made of a silicon nitride film is formed to a thickness of 300 nm. Actually, although the protective electrode 352 functions to protect the EL layer from moisture or the like, the reliability of the EL element can be further raised by forming the second passivation film 353.

In the case of this embodiment, as shown in FIG. 10C, an active layer of an n-channel TFT 205 includes a source region 355, a drain region 356, an LDD region 357, and a channel formation region 358, and the LDD region 357 overlaps with the gate electrode 312 through the gate insulating film 310.

The reason why the LDD region is formed only at the drain region side is in consideration so as not to drop the operation speed. Besides, in this n-channel TFT 205, there is little need to take the off current value into consideration, but importance should be attached to the operation speed. Accordingly, it is desirable to make the LDD region 357 completely overlap with the gate electrode and to decrease a resistance component to the utmost. That is, it is preferable to remove so-called offset.

In this way, an active matrix substrate having the structure as shown in FIG. 10C is completed. Note that it is effective to continuously perform steps up to formation of the passivation film 353, after formation of the bank 349, without opening to the air by using a thin film forming device of a multi-chamber system (or inline system).

Note that an optimum structured TFT is disposed in not only the pixel portion but also the driver circuit portion, so that the active matrix substrate of this embodiment has very high reliability and the operation characteristics can also be improved.

First, a TFT having a structure to lower hot carrier injection so that the operation speed is not dropped as much as possible is used as the n-channel TFT 205 of the CMOS circuit constituting the driver circuit portion. Note that the driver circuit here includes a shift register, a buffer, a level shifter, a sampling circuit (sample and hold circuit) and the like. In the case of digital driving, a signal conversion circuit such as a D/A converter can also be included.

Among the driver circuits, the sampling circuit is rather specific as compared with other circuits, and a large current flows through the channel formation region in both directions. That is, roles of a source region and a drain region are counterchanged. Further, it is necessary to suppress the off current value to the utmost degree, and in such meaning, it is desirable to dispose a TFT having a function of a middle level between the switching TFT and the current controlling TFT.

Figure 11:
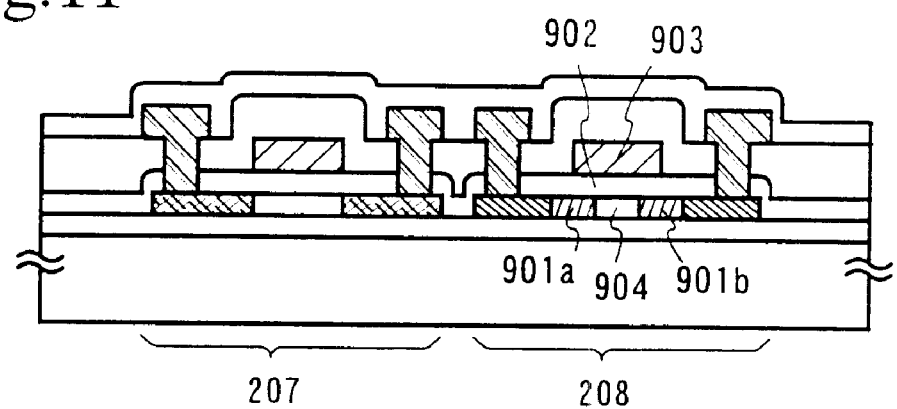
FIG. 11 is a view showing an element structure of a sampling circuit.

Accordingly, as an n-channel TFT forming the sampling circuit, it is desirable to dispose a TFT having a structure as shown in FIG. 11. As shown in FIG. 11, a part of LDD regions 901*a* and 901*b* overlap with a gate electrode 903 through a gate insulating film 902. This effect is a countermeasure against hot carrier injection occurring when a current is made to flow, and in the case of the sampling circuit, there is a difference in that they are provided at both sides of the channel formation region 904.

Actually, when the device is completed up to FIG. 10C, it is preferable to package (seal) it with a cover member such as glass, quartz or plastic having high airtightness so that it is not exposed to the outside air. At that time, it is appropriate that a moisture absorbent such as barium oxide or an anti-oxidizing agent is disposed in the inside of the cover member.

After the airtightness is raised by the treatment such as packaging, a connector (flexible printed circuit: FPC) for connecting a terminal extended from a component or a circuit formed on the insulator with an external signal terminal is attached so that a product is completed. The device put in the state where it can be shipped like this is called an EL display device (or EL module) in the present specification.

Here, the structure of an active matrix type EL display device of this embodiment will be described with reference to a perspective view of FIG. 12. The active matrix type EL display device of this embodiment includes a pixel portion 602, a gate side driver circuit 603, and a source side driver circuit 604, which are formed on a glass substrate 601. A switching TFT 605 in a pixel portion is an n-channel TFT and is disposed at an intersection between a gate wiring 606 connected to the gate side driver circuit 603 and a source wiring 607 connected to the source side driver circuit 604. A drain of the switching TFT 605 is connected to a gate of a current controlling TFT 608.

Further, a source side of the current controlling TFT 608 is connected to a power supply line 609. In the structure as in this embodiment, a ground potential (earth potential) is given to the power supply line 609. Besides, an EL element 610 is connected to a drain of the current controlling TFT 608. A predetermined voltage (3 to 12 V, preferably 3 to 5 V) is applied to an anode of this EL element 610.

Connection wirings 612, 613 and 614 for transmitting a signal to a driver circuit portion and a connection wiring 614 connected to the power supply line 609 are provided at an FPC 611 which becomes an external input/output terminal.

Figure 12:
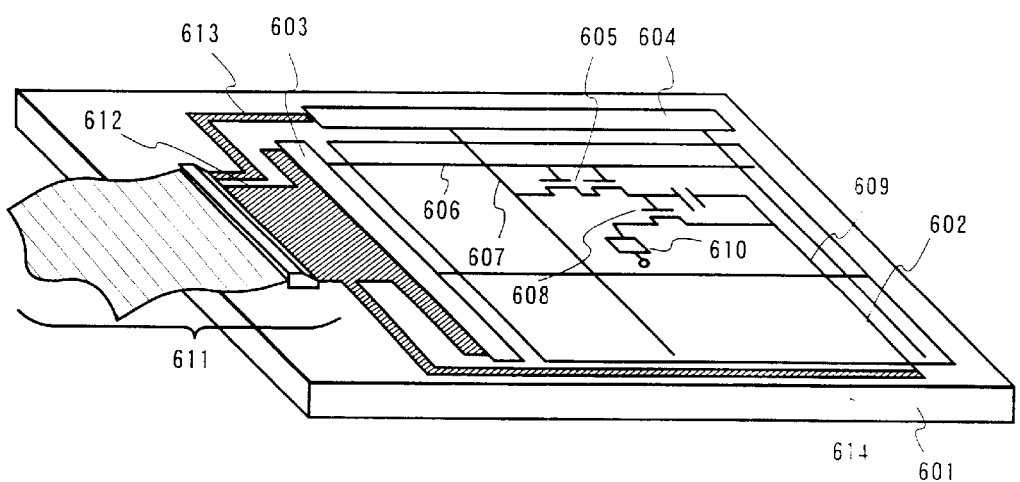
FIG. 12 is a view showing an external appearance of an EL display device.
Figure 13:
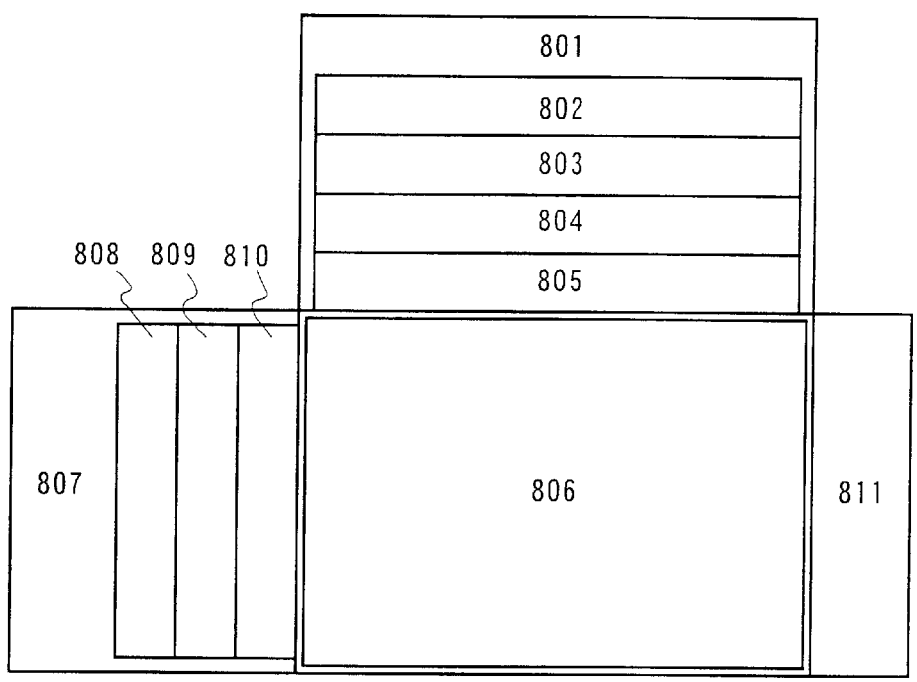
FIG. 13 is a view showing a circuit block structure of an EL display device.

An example of the circuit structure of the EL display device shown in FIG. 12 is shown in FIG. 13. The EL display device of this embodiment includes a source side driver circuit 801, a gate side driver circuit (A) 807, a gate side driver circuit (B) 811, and a pixel portion 806. In the present specification, the driver circuit portion is a general term including the source side driver circuit and the gate side driver circuit.

The source side driver circuit 801 includes a shift register 802, a level shifter 803, a buffer 804, and a sampling circuit (sample and hold circuit) 805. The gate side driver circuit (A) 807 includes a shifter register 808, a level shifter 809, and a buffer 810. The gate side driver circuit (B) has also a similar structure.

Here, the shift register 802, 808 has a driving voltage of 5 to 16 V (typically 10 V), and the structure designated by 205 in FIG. 10C is suitable for an n-channel TFT used for a CMOS circuit constituting the circuit.

Similarly to the shift register, the CMOS circuit including the n-channel TFT 205 of FIG. 10C is suitable for the level shifter 803, 809, and the buffer 804, 810. Note that it is effective to make the gate wiring have a multigate structure such as a double gate structure or triple gate structure in improving the reliability of each circuit.

In the sampling circuit 805, the source region and the drain region are inverted, and it is necessary to decrease the off current value, so that the CMOS circuit including the n-channel TFT 208 of FIG. 11 is suitable.

In the pixel portion 806, pixels each having the structure shown in FIG. 6 are arranged.

The above structure can be easily realized by fabricating TFTs in accordance with the fabricating steps shown in FIGS. 8A to 10C. Besides, in this embodiment, although only the structure of the pixel portion and the driver circuit portion are shown, in accordance with the fabricating steps of this embodiment, it is possible to form a logical circuit other than the driver circuit, such as a signal dividing circuit, a D/A converter circuit, an operational amplifier circuit, or a γ-correction circuit, on the same insulator, and further, it is considered that a memory portion, a microprocessor, and the like can be formed.

Further, an EL module of this embodiment including a cover member will be described with reference to FIGS. 14A and 14B. If necessary, reference characters used in FIGS. 12 and 13 are cited.

FIG. 14A is a top view showing a state in which a sealing structure is provided in the state shown in FIG. 12. Reference numeral 602 indicated by a dotted line designates a pixel portion; 603, a gate side driver circuit; and 604, a source side driver circuit. The sealing structure of the present invention is a structure in which a cover member 1101 and a sealing member (not shown) are provided to the state of FIG. 12.

Here, FIG. 14B is a sectional view taken along A—A' of FIG. 14A. In FIGS. 14A and 14B, the same portions are designated by the same characters.

As shown in FIG. 14B, a pixel portion 602 and a gate side driver circuit portion 603 are formed on a substrate 601, and the pixel portion 602 is formed of a plurality of pixels each including a current controlling TFT 202 and a pixel electrode 346 electrically connected to that. The gate side driver circuit 603 is constituted by using a CMOS circuit in which an n-channel TFT 205 and a p-channel TFT 206 are complementarily combined.

A pixel electrode 348 functions as an anode of an EL element. Banks 349 are formed at both ends of the pixel electrode 348, and an EL layer 350 and a cathode 351 are formed in the inside of the banks 349. A protective electrode 352 and a second passivation film 353 are formed thereon. Of course, as set forth also in the description of the embodiment modes for carrying out the present invention, the structure of the EL element may be reversed and the pixel electrode may be a cathode.

In the case of this embodiment, the protective electrode 352 functions also as a wiring common to all pixels, and is electrically connected to an FPC 611 through a connection wiring 612. Further, all elements included in the pixel portion 602 and the gate side driver circuit 603 are covered with the second passivation film 353. Although this second passivation film 353 can be omitted, it is preferable that this is provided to block the respective elements from the outside.

A cover member 1001 is bonded by a sealing member 1004. A spacer made of a resin film may be provided to secure an interval between the cover member 1004 and the light emitting element. An inside 1103 of the sealing member 1004 is a sealed space and is filled with an inert gas such as nitrogen or argon. It is also effective to provide a moisture absorbent typified by barium oxide in the sealed space 1103.

Further, it is also possible to provide a filler in this space 1103. As the filler, PVC (polyvinyl chloride), epoxy resin, silicon resin, PVB (polyvinyl butyral) or EVA (ethylene-vinyl acetate) can be used.

In this embodiment, as the cover member 1101, a material made of glass, plastic, or ceramic can be used.

As the sealing member 1104, although it is preferable to use a photo-curing resin, a thermosetting resin may be used if the heat resistance of the EL layer permits. Besides, it is preferable that the sealing member 1104 is a material through which the least possible moisture and oxygen permeate. A drying agent may be added in the inside of the sealing member 1104.

By enclosing the EL element by using the system as described above, the EL element can be completely blocked from the outside, and it is possible to prevent a substance which facilitates deterioration of the EL layer by oxidation, such as moisture or oxygen, from intruding from the outside. Accordingly, it is possible to fabricate the EL display device with high reliability. Note that, in this embodiment, although the example in which three kinds of stripe-shaped EL layers emitting red, green and blue lights are respectively formed in the vertical direction, they may be formed in the horizontal direction.

The structure of this embodiment can be freely combined with any structure of Embodiments 1 to 5.

Embodiment 7

Next, a fabricating method when an improvement is applied to an electrode hole explained in FIG. 6 will be described with reference to a sectional view of FIGS. 15A to 15C.

Figure 15A:
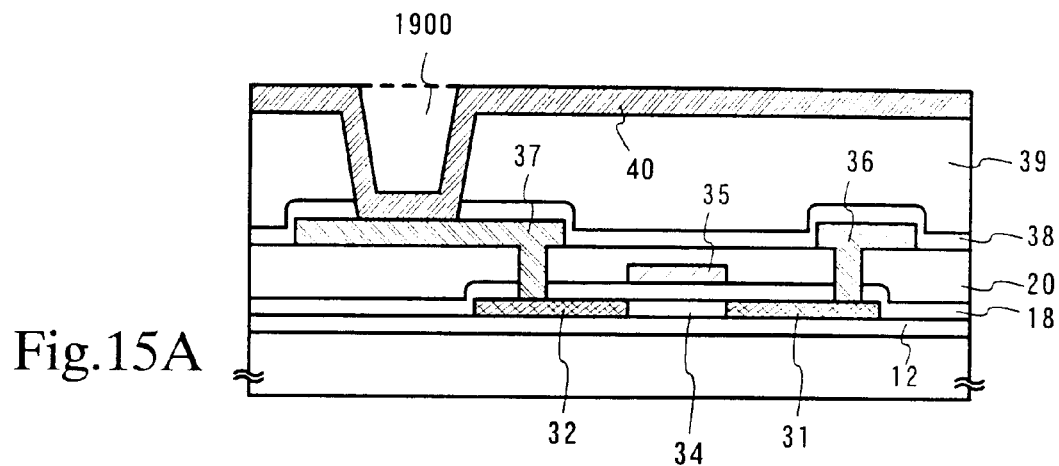
FIGS. 15A to 15C are views showing a sectional structure of a pixel portion of an EL display device.
Figure 15B:
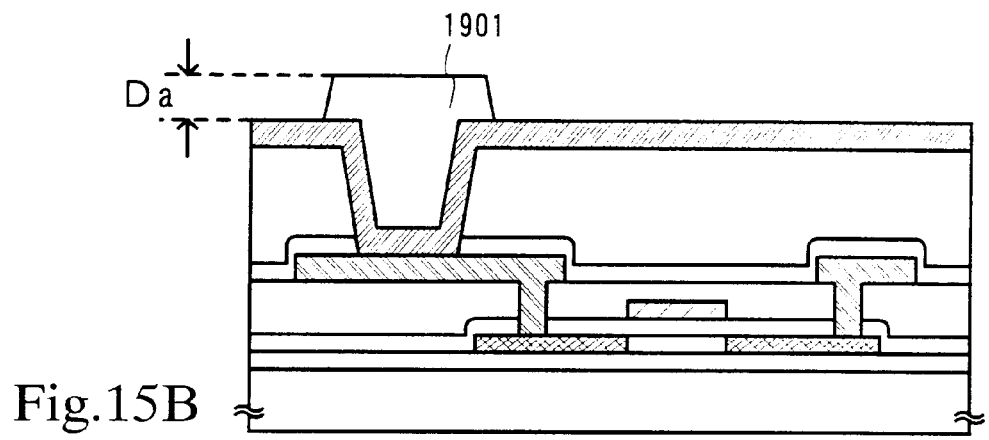
Figure 15C:
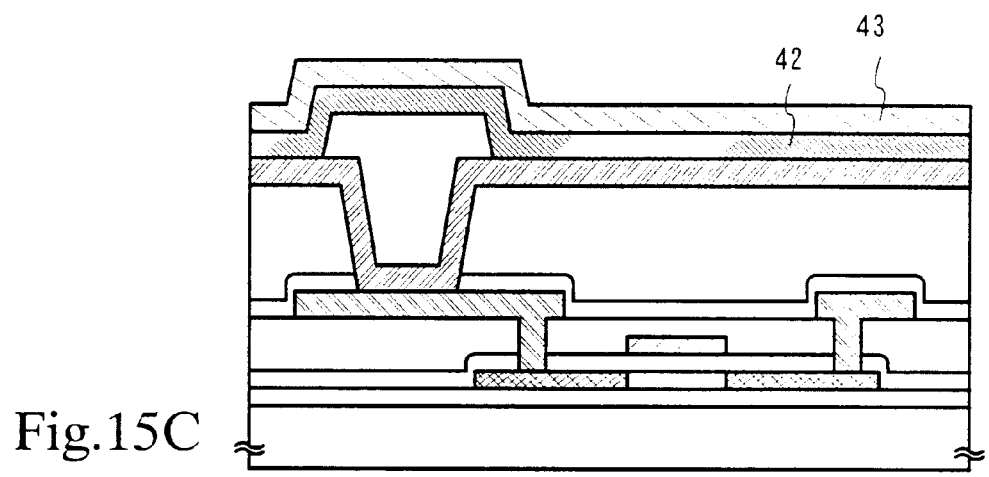

Note that numerals in FIGS. 15A to 15C correspond to numerals in FIG. 6, and a pixel electrode (anode) 40 constituting an EL element as shown in FIG. 15A is formed in accordance with the steps of Embodiment 5.

Next, an electrode hole 1900 is filled with acrylic resin, and a protective portion 1901 is provided as shown in FIG. 15B.

Here, a film of acrylic resin is formed by a spin coating method and after exposure using a resist mask, etching is performed, so that the protective portion 1901 as shown in FIG. 15B is formed.

Concerning the protective portion 1901, it is appropriate that the thickness of a portion (portion indicated by Da in FIG. 15B) rising from the pixel electrode is 0.1 to 1 μm, preferably 0.1 to 0.5 μm, more preferably 0.1 to 0.3 μm, seen in section. After the protective portion 1901 is formed, an EL layer 42 is formed as shown in FIG. 15C, and further, a cathode 43 is formed. A method which is similar to that of Embodiment 5 may be used as a fabricating method of the EL layer 42 and the cathode 43.

As the protective portion 1901, organic resin is preferable, and it is appropriate that a material such as polyimide, polyamide, acrylic resin, or BCB (benzocyclobutene) is used. When such organic resin is used, it is appropriate that its viscosity is made $10^{-3}$ Pa·s to $10^{-1}$ Pa·s.

By making the structure as shown in FIG. 15C following the manner as described above, it is possible to solve a problem of short circuit between the pixel electrode 40 and the cathode 43, which occurs when the EL layer 42 is cut at the stepped portion of the electrode hole. FIG. 16 is a top view of the pixel portion shown in FIGS. 15A to 15C. Note that reference numerals used in FIG. 16 are coincident with the reference numerals of FIGS. 15A to 15C, and the protective portion 1901 shown in this embodiment corresponds to a position indicated by 1901 of FIG. 16 when it is seen in the top view.

Besides, the structure of this embodiment can be freely combined with any structure of Embodiments 1 to 6.

Embodiment 8

When the active matrix type EL display device of the present invention is seen in the direction of FIG. 14A, pixel arrays may be formed into a stripe shape in the vertical direction or may be formed into a delta arrangement.

Figure 17A:
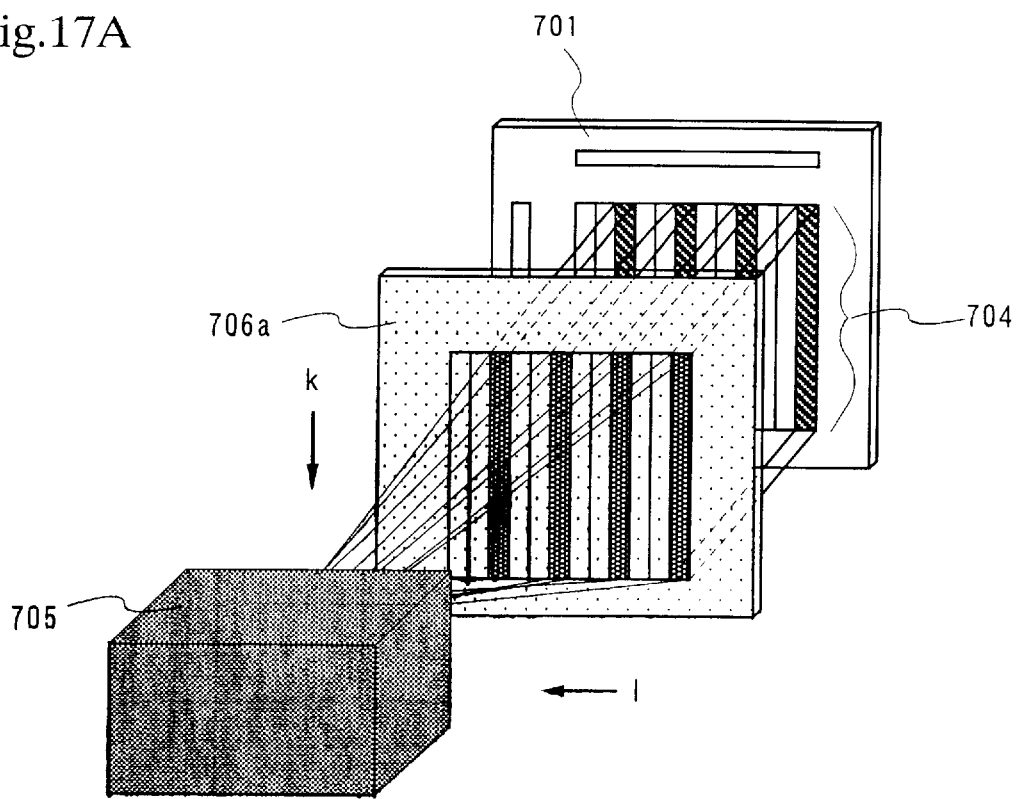
FIGS. 17A and 17B are views showing coating methods of organic EL materials of the present invention.

Here, FIG. 17A shows a state where pixels of three colors of red, green and blue are formed into the stripe shape. Note that it is not always necessary that the colors of the pixels are three colors, but one color or two colors may be used. Besides, the colors are not limited to red, green and blue, but other colors such as yellow, orange or gray may be used.

The positional relation among a substrate 701, a coating liquid chamber 705 containing coating liquid, and a mask 706a for controlling the coating liquid is as shown in FIG. 17A.

First, coating liquid for a red EL layer is contained in the coating liquid chamber 705, and an atomized coating liquid is discharged from the coating liquid chamber 705. At this time, since a voltage is applied to the mask 706a, when the discharged atomized coating liquid reaches the mask 706a, it is controlled by an electric field, passes through the mask 706a, and reaches a desired pixel portion 704. Accordingly, coating control to a desired position of the pixel portion 704 becomes possible. It is sufficient if a voltage of several tens of V to 10 kV is applied to the mask 706a.

Note that at the time of coating, the coating may be carried out while the coating liquid chamber 705 is moved in the vertical direction (direction of arrow k) or the substrate 701 may be moved.

The coating liquid for the red EL layer is coated as shown in FIG. 17A. Since the voltage is applied to the mask 706a, the coating liquid can be selectively coated to the desired position of the pixel portion 704.

Although FIG. 17A shows the state where only the coating liquid for a red EL layer is coated, after the coating liquid for a red EL layer is coated, the mask 706a is moved by one line in the horizontal direction indicated by arrow 1, and the coating liquid for a green EL layer is coated. Thereafter, after the mask 706a is further moved by one line in the horizontal direction indicated by arrow 1, the coating liquid for a blue layer is coated, so that stripe-shaped EL layers of red, green and blue are formed in the pixel portion 704.

Figure 17B:
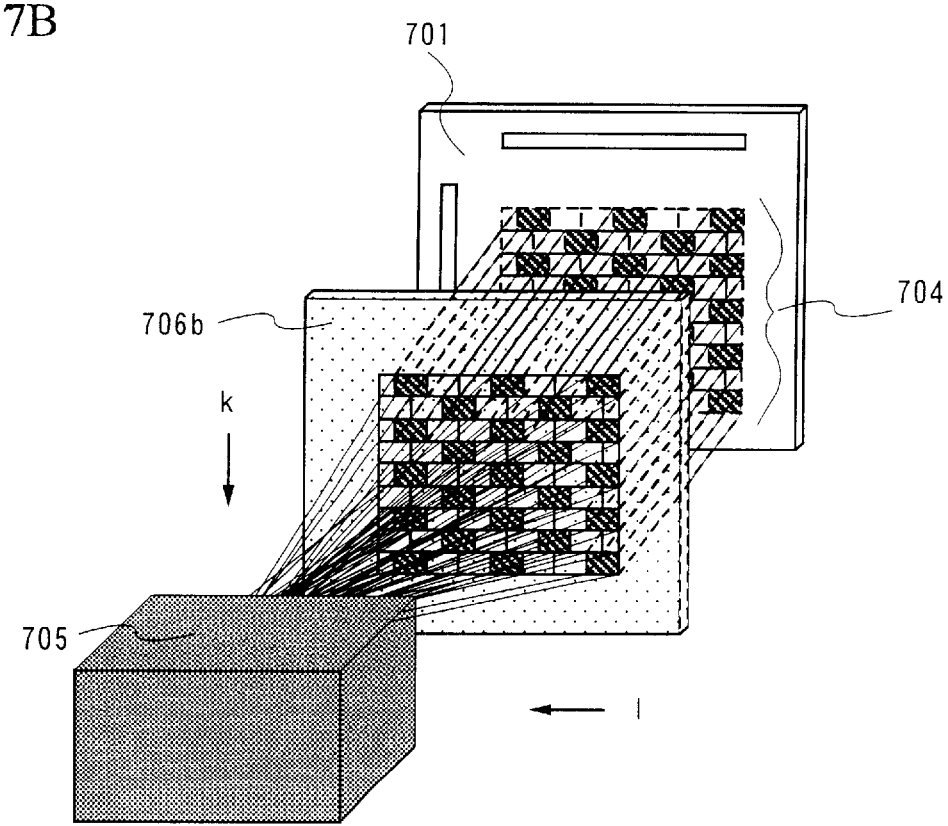

Next, FIG. 17B shows the positional relation among a substrate 701, a coating liquid chamber 705 containing a coating liquid, and a mask 706b for controlling the coating liquid, when a pixel portion of red, green and blue is formed into the delta arrangement.

Note that, also when the pixel portion of the delta arrangement is formed, similarly to the case where the pixel portion 704 is formed into the stripe shape, after the coating liquid for a red EL layer is coated, the mask 706b is moved, and the coating liquid for a green layer is coated, and further, the mask 706b is moved, and the coating liquid for a blue layer is coated. In this way, the EL layers of the delta arrangement emitting red, green and blue can be formed in the pixel portion 704.

Figure 18A:
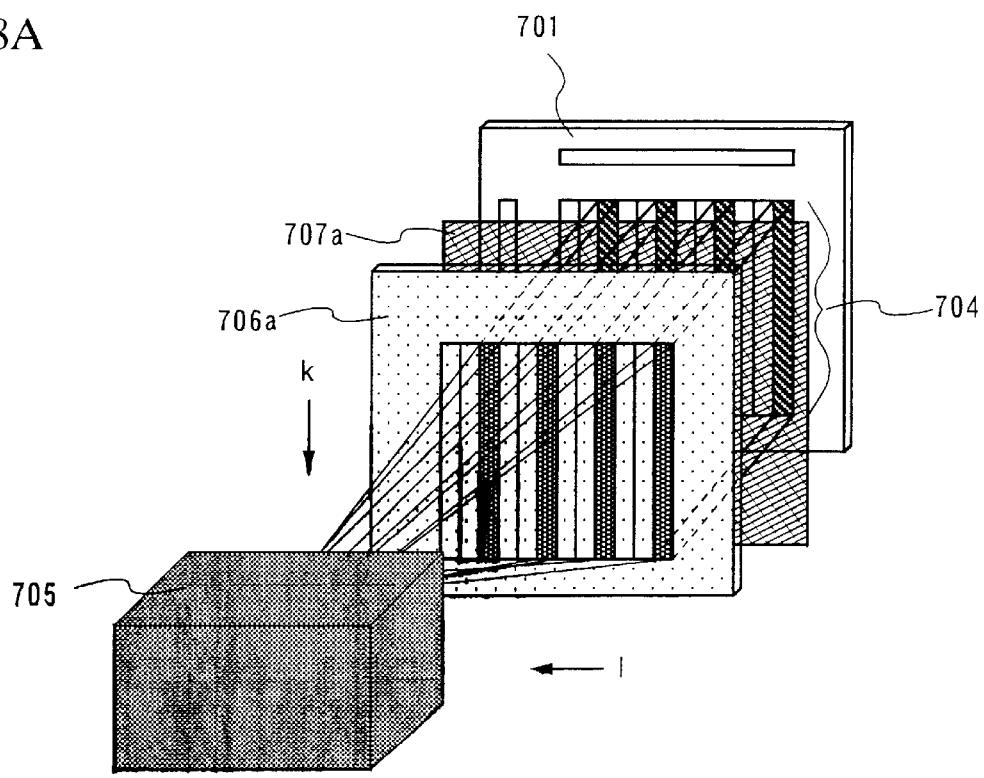
FIGS. 18A and 18B are views showing coating methods of organic EL materials of the present invention.
Figure 18B:
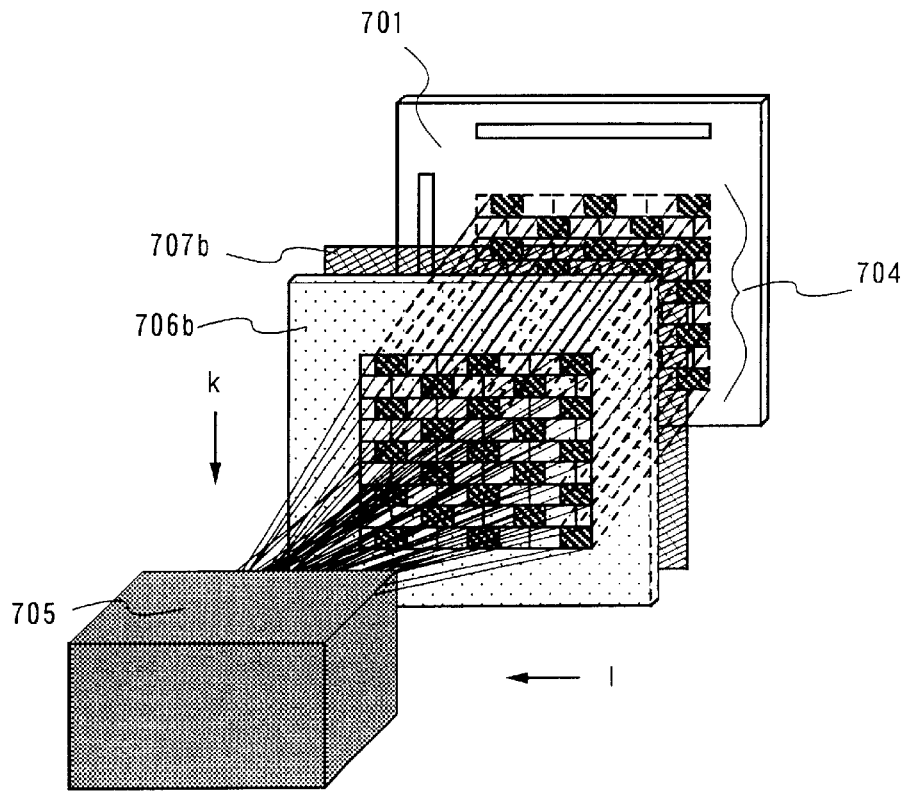

FIGS. 18A and 18B show examples in which a second mask 707a is further provided between a substrate and a first mask 706a. Since the structure is the same as that of FIGS. 17A and 17B except that the second mask is provided, the same numerals are used.

First, the positional relation among a substrate 701, a coating liquid chamber 705 containing coating liquid, a first mask 706a for controlling a coating liquid. and a second mask 707a is as shown in FIG. 18A.

First, the coating liquid for a red EL Layer is contained in the coating liquid chamber 705, and atomized coating liquid is discharged from the coating liquid chamber 705. At this time, since a voltage is applied to the first mask 706a, when the discharged atomized coating liquid reaches the first mask 706a, it is controlled by an electric field and passes through the first mask 706a, and further, passes through the second mask 707a and reaches a desired pixel portion 704. Since a voltage is applied to the second mask 707a similarly to the first mask, when the discharged atomized coating liquid reaches the second mask 707a. it is controlled by an electric field. Accordingly, coating control to the desired position of the pixel portion 704 becomes possible. It is appropriate that a voltage of several tens of V to 10 kV is applied to the first mask 706a and the second mask 707a.

Next, FIG. 18B shows the positional relation among a substrate 701, a coating liquid chamber 705 containing coating liquid, and a first mask 706b and a second mask 707b for controlling the coating liquid, when red, green and blue pixel portions are formed into the delta arrangement.

Figure 19A:
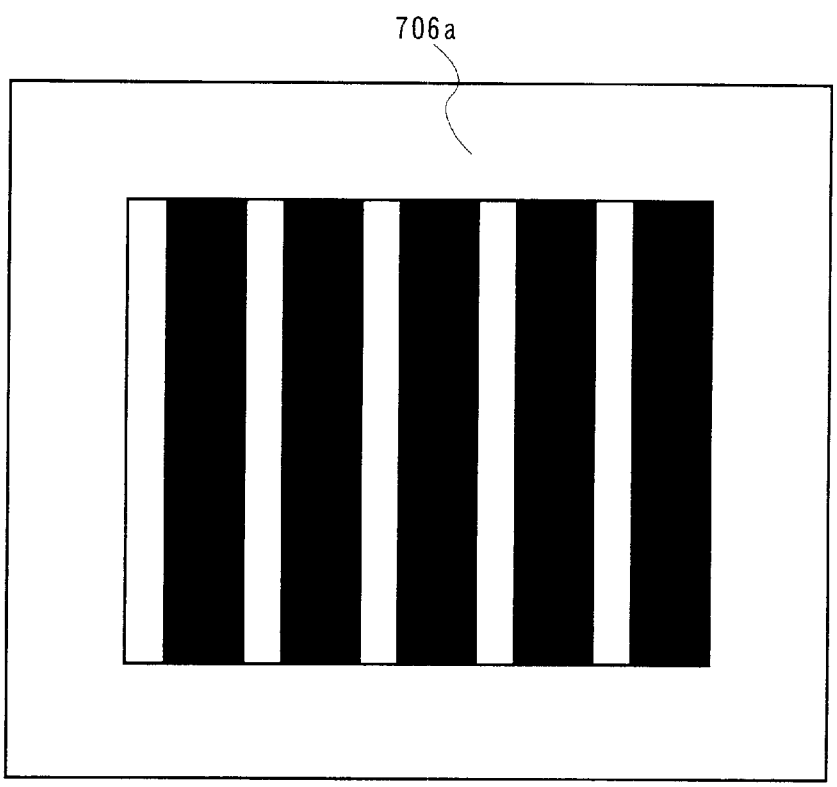
FIGS. 19A and 19B are views showing mask patterns used for coating of organic EL materials.
Figure 19B:
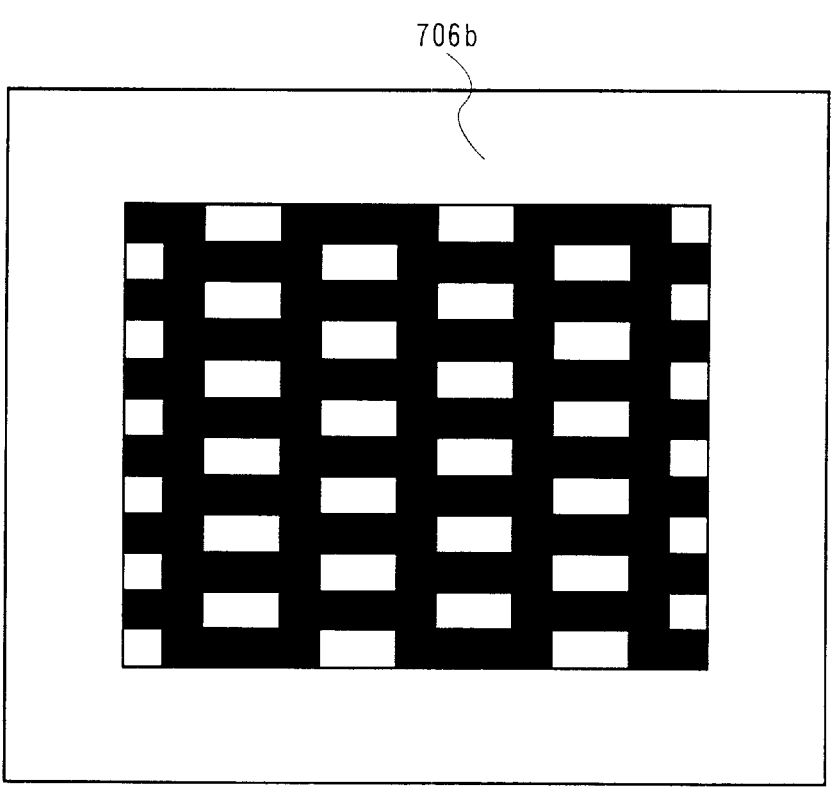

It is appropriate that, as the mask for forming the stripe-shaped EL layers in the pixel portion 704, the stripe-shaped mask 706a shown in FIG. 19A is used, and as the mask for forming pixels of the delta arrangement, the delta arrangement mask 706b shown in FIG. 19B is used.

Besides, in the case where the first mask and the second mask are used as shown in FIGS. 18A and 18B, in the case where the stripe-shaped mask is used as the first mask, it is appropriate that the stripe-shaped mask or conductive lines are used also as the second mask. In the case where the delta arrangement mask is used as the first mask, it is appropriate that the delta arrangement mask or conductive lines are used also as the first mask. However, in the case where the conductive lines are used as the second mask, it is appropriate that they are arranged not to overlap with the opening portions of the first mask.

Figure 20A:
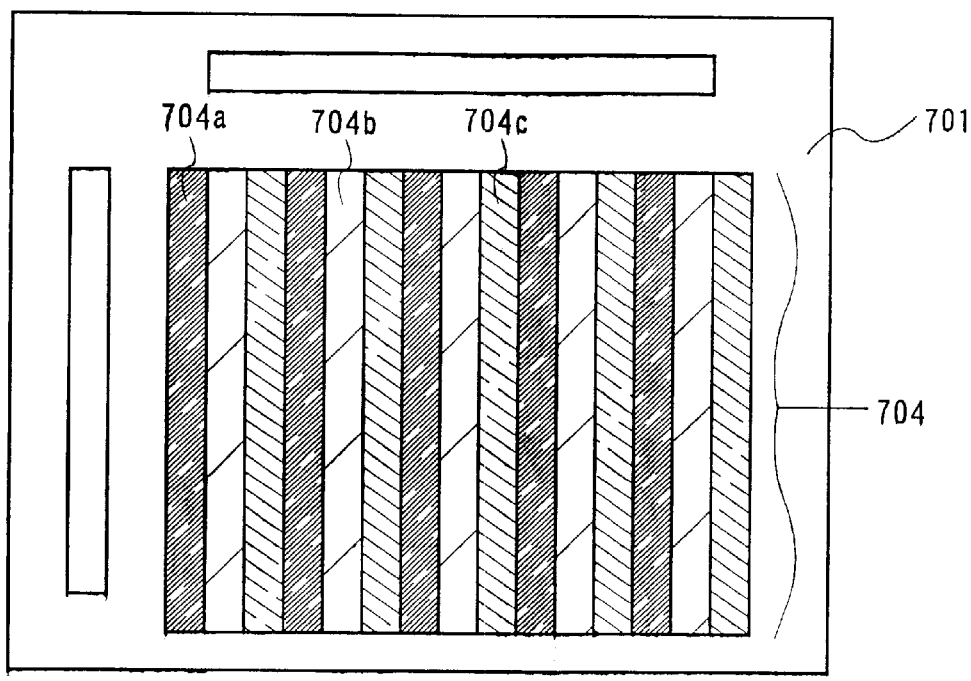
FIGS. 20A and 20B are views showing coating patterns of organic EL materials.
Figure 20B:
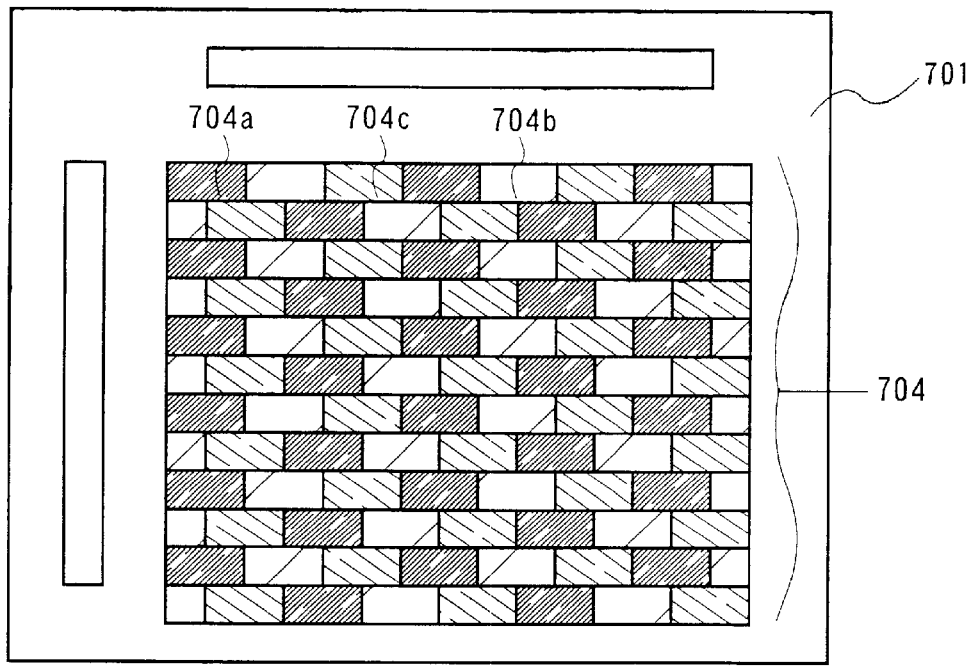

When the coating liquid for red EL layer, the green EL layer, and blue EL layer is formed on the pixel portion 704 by using these masks, it is possible to form stripe-shaped pixels in the pixel portion 704 as shown in FIG. 20A, or to form delta arrangement pixels in the pixel portion 704 as shown in FIG. 20B.

In FIG. 20A, reference numeral 704a designates an EL layer emitting red light; 704b, an EL layer emitting green light; and 704c, an EL layer emitting blue light. Note that banks (not shown) are formed into the stripe shape, over source wirings through an insulating film and along the source wirings in the vertical direction.

The EL layer here indicates a layer made of an organic EL material contributing to light emission, such as an EL layer, a charge injecting layer, or a charge transporting layer. Although there can be a single layer of an EL layer, for example, in the case where a hole injecting layer and an EL layer are laminated, the laminate film is called an EL layer.

At this time, it is desirable that a mutual distance (D) of adjacent pixels of the same color in a line shape is made not less than five times (preferably not less than ten times) as long as the thickness (t) of the EL layer. This is because a problem of cross talk can occur between the pixels when $D<5t$. If the distance (D) is too long, it becomes impossible to obtain a image with high definition. Thus, it is preferable to make $5t<D<50t$ (preferably $10t<D<35t$).

Besides, the bank may be formed into the stripe shape in the horizontal direction, and the EL layer emitting red light, the EL layer emitting green light, and the EL layer emitting blue light may be formed horizontally. At this time, the bank is formed over the gate wiring through the insulating film along the gate wiring.

Also in this case, it is desirable that a mutual distance (D) of adjacent pixels of the same color in a line shape is made five times or more (preferably ten times or more) as long as the thickness (t) of the EL layer, more preferably 5t<D<50t (preferably 10t<D<35t).

As in this embodiment, by electrically controlling the coating liquid for forming the EL layer, it becomes possible to control the coating position.

Incidentally, the structure of this embodiment can be freely combined with any structure of Embodiments 1 to 7.

Embodiment 9

Figure 21:
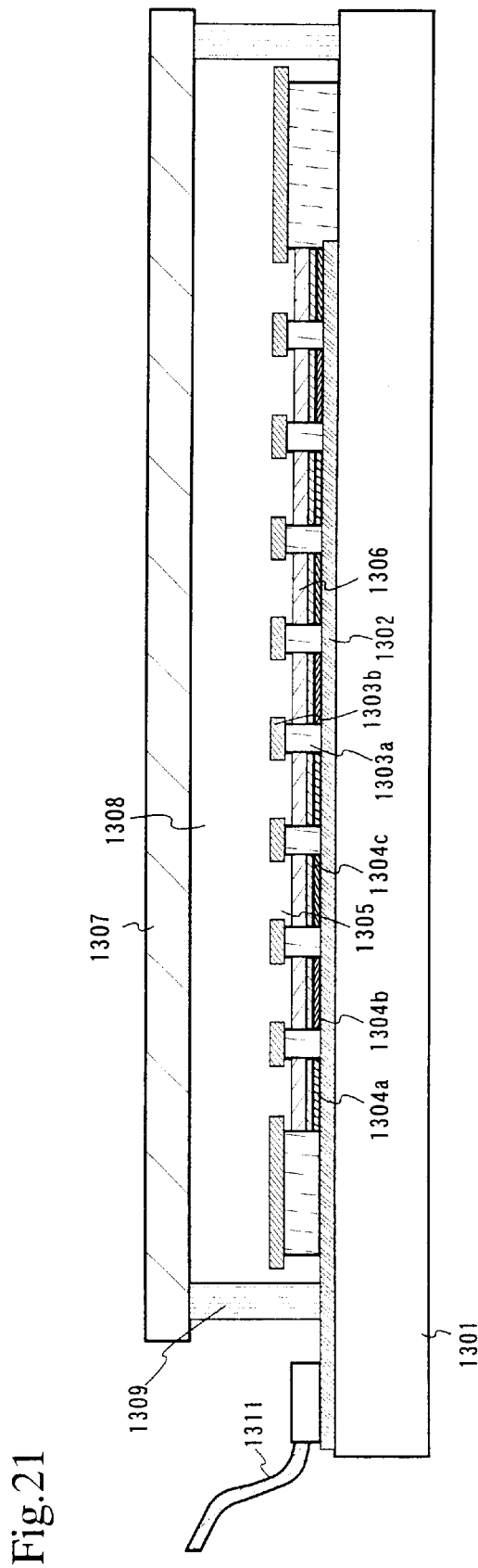
FIG. 21 is a view showing a sectional structure of a passive type EL display device.

A case of using the present invention in a passive type (simple matrix type) EL display device is explained in Embodiment 9. FIG. 21 is used in the explanation. In FIG. 21, reference numeral 1301 denotes a substrate made of plastic, and 1306 denotes an anode made of a transparent conductive film. In Embodiment 9, as the transparent conductive film, a compound of indium oxide and zinc oxide is formed by an evaporation method. Note that, although not shown in FIG. 21, a plurality of anodes are arranged in a stripe shape, in a perpendicular direction to a defined space.

Further, banks 1303 are formed so as to fill up the space between the anodes 1302 arranged in the stripe shape. The banks 1303 are formed along the anodes 1302 in a perpendicular direction to the defined space.

Subsequently, EL layers 1304a to 1304c made of a polymer-based organic EL material are formed by the film deposition method shown in FIG. 1. Note that reference numeral 1304a is an EL layer emitting red color, 1304b is an EL layer emitting green color, and 1304c is a light emitting layer emitting blue color. The organic EL material used may be similar to that used in Embodiment 1. The EL layers are formed along grooves, which are formed by the banks 1302, and therefore are arranged in a stripe shape, in a perpendicular direction to the defined space.

Note that, in Embodiment 9, the position where a coating liquid is coated on an anode is controlled by using a mask, and it may be controlled by applying a voltage on an anode.

Next, although not shown by FIG. 21, a plurality of cathodes and a plurality of protecting electrodes have longitudinal directions in parallel directions with the defined space, and are arranged in a stripe shape orthogonal to the anodes 1302. Note that the cathodes 1305 are MgAg, and that the protecting electrodes 1306 are aluminum alloy films in Embodiment 9, and both are formed by the evaporation method. Further, although not shown in the figure, a wiring is extended to a portion in which an FPC is later attached so as to apply a predetermined voltage to the protecting electrodes 1306 not shown.

Further, after forming the protecting electrodes 1306, not shown in the figure, a silicon nitride film may be formed here as a passivation film.

An EL element is thus formed on the substrate 1301. Note that the lower side electrodes are transparent anodes in Embodiment 9, and therefore light emitted by the EL layers 1304a to 1304c is emitted to the lower surface (the substrate 1301). However, the EL element structure can be inverted and the lower electrodes can be made into light shielding cathodes. In that case, light emitted by the EL layers 1304a to 1304c is irradiated to an upper surface (the side opposite the substrate 1301).

Next, a ceramic substrate is prepared as a cover member 1307. A ceramic substrate is used because the cover member may be light shielding with the structure of Embodiment 9, but of course a substrate made from plastic or glass may also be used for a case of inverted EL element structure, like that stated above, in which preferably the cover member should be transparent.

After thus preparing the cover member 1307, it is joined by a filler 1308 which has barium oxide added as a drying agent (not shown in the figure). A frame material 1310 is then attached using a sealing member 1309 made from an ultraviolet hardening resin. Stainless steel is used as the frame material 1310 in Embodiment 9. Lastly, an FPC 1312 is attached through an anisotropic conducting film 1311, and the passive type EL display device is completed.

Note that it is possible to implement the constitution of Embodiment 9 by freely combining it with the constitution of any of Embodiments 1 to 8.

Embodiment 10

In this embodiment, an example in which a coating position is controlled by using a mask to which different voltages are partially applied, will be described with reference to FIG. 3A.

In FIG. 3A, reference numeral 1210 designates a substrate; and 1211 is a coating liquid chamber. The coating liquid chamber 1211 contains a coating liquid. Here, there is shown an example in which an organic EL material of polymer is dissolved in a solvent and is coated.

In this embodiment, the coating liquid of the coating liquid chamber 1211 is atomized by an ultrasonic vibrator 1212 and is discharged. An electrode 1222 is connected to the coating liquid chamber 1211, and certain potential is previously applied to the coating liquid when it is discharged. After the discharged coating liquid passes through gaps of a mask 1213 made of conductive material, it is coated on pixel electrodes over substrate 1210.

When the coating liquid passes through the mask 1213, as shown in FIG. 3B of an enlarged view of a portion 1217, its flying direction is controlled by the mask. As shown in FIG. 3C, the mask 1213 has blocking portions 1218 which are conductive lines arranged into a stripe shape and made of conductive material such as platinum (Pt), gold (Au), copper, iron, aluminum, tantalum, titanium, or tungsten. When the mask 1213 shown in FIG. 3C is seen from the direction of arrow m, the stripe-shaped mask 1213 of FIG. 3B is obtained.

As shown in FIG. 3C, a first voltage (controlled by a first power supply 1220) is applied to a blocking portion 1218a of the mask, and a second voltage (controlled by a second power supply 1221) is applied to a blocking portion 1218b of the mask, so that the flying direction of the coating liquid is controlled, and the coating position is controlled. Here, the second voltage is made a value different from the first voltage.

Incidentally voltages are applied to the blocking portions 1218a and 1218b of the mask 1213 to produce such potentials that the atomized coating liquid and the blocking portions 1218a and 1218b of the mask 1213 repel each other. Accordingly, the coating liquid can pass through the gaps between the blocking portions 1218a and 1218b of the mask 1213.

The gap of the blocking portions 1218a and 1218b may be made to coincide with a pixel pitch of the pixel electrodes formed over the substrate.

Note that reference numeral 1214 shown in FIG. 3A designates an extracting electrode which applies an electric field for extracting the atomized coating liquid to a next electrode. Reference numeral 1215 designates an acceleration electrode which applies to the coating liquid an electric field for accelerating the flying speed of the extracted coating liquid. Further, reference numeral 1216 designates a control electrode which is an electrode for applying a voltage to make electric field control so that the coating liquid can be coated on a desired position on the substrate 1210. It is not always necessary that the number of the electrodes is three.

The structure as shown in FIG. 3A is made, and by suitably adjusting the voltage applied to the blocking portions 1218*a* and the voltage applied to the blocking portions 1218*b*, the coating position can be controlled with high accuracy.

Further, in this embodiment, an electric filed may be applied such that a voltage is previously applied to the pixel electrodes (anodes) formed over the substrate 1210, and the coating liquid having passed through the mask is further controlled to be selectively coated on the desired position.

Besides, the structure of this embodiment can be freely combined with any structure of Embodiments 1 to 9.

Embodiment 11

When the present invention is implemented to manufacture an active matrix EL display device, it is effective to use a silicon substrate (silicon wafer) as a substrate. In the case of using the silicon substrate as the substrate, a manufacturing technique of MOSFET utilized in the conventional IC, LSI or the like can be employed to manufacture a switching element and a current control element to be formed in the pixel portion, or a driver element to be formed in the driver circuit portion.

The MOSFET can form circuits having extremely small variations as achievements in the IC and the LSI. Particularly, it is effective for the active matrix EL display device with an analog driver of performing gradation display by an electric current value.

It is to be noted that the silicon substrate is not transmissive, and therefore the structure needs to be constructed so that light from the EL layer is irradiated to a side opposite the substrate. The structure of the EL display device of Embodiment 11 is similar to that of FIG. 14. However, the difference is that the MOSFET is used for forming a pixel portion 602 and a driver circuit portion 603 instead of a TFT.

Note that it is possible to implement the structure of this embodiment freely combining it with the structure of any of Embodiments 1 to 10.

Embodiment 12

An EL display device formed by implementing the present invention has superior visibility in bright locations in comparison to a liquid crystal display device because it is a self-emissive type device, and moreover its field of vision is wide. Accordingly, it can be used as a display portion for various electronic devices. For example, it is appropriate to use the EL display device of the present invention as a display portion of an EL display (a display incorporating the EL display device in its casing) having a diagonal equal to 30 inches or greater (typically equal to 40 inches or greater) for appreciation of TV broadcasts by large screen.

Note that all displays exhibiting (displaying) information such as a personal computer display, a TV broadcast reception display, or an advertisement display are included as the EL display. Further, the EL display device of the present invention can be used as a display portion of the other various electronic devices.

The following can be given as examples of such electronic devices: a video camera; a digital camera; a goggle type display (head mounted display); a car navigation system; an audio reproducing device (such as a car audio system, an audio compo system); a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital video disk (DVD)). In particular, because portable information terminals are often viewed from a diagonal direction, the wideness of the field of vision is regarded as very important. Thus, it is preferable that the EL display device is employed. Examples of these electronic devices are shown in FIGS. 22 to 23.

Figure 22A:
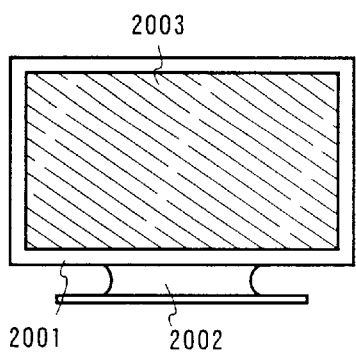
FIGS. 22A to 22F are views showing specific examples of electronic instruments.

FIG. 22A is an EL display, containing a casing 2001, a support stand 2002, and a display portion 2003. The present invention can be used in the display portion 2003. Since the EL display is a self-emissive type device without the need of a backlight, its display portion can be made thinner than a liquid crystal display device.

Figure 22B:
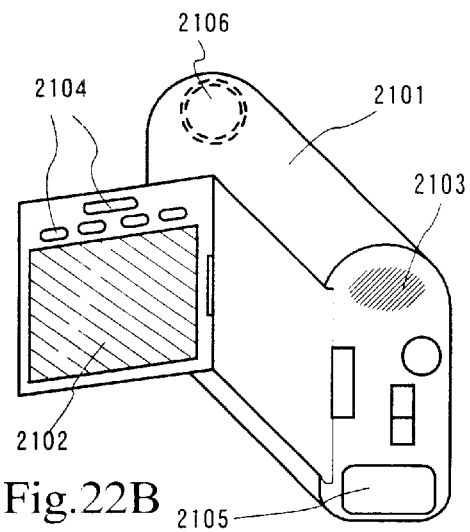

FIG. 22B is a video camera, containing a main body 2101, a display portion 2102, an audio input portion 2103, operation switches 2104, a battery 2105, and an image receiving portion 2106. The EL display device of the present invention can be used in the display portion 2102.

Figure 22C:
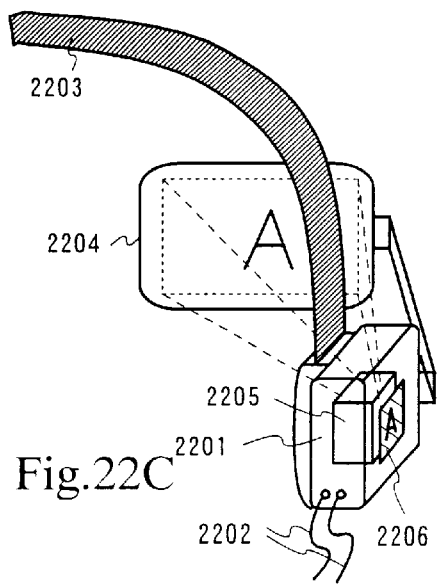

FIG. 22C is a portion of a head fitting type EL display (right side), containing a main body 2201, a signal cable 2202, a head fixing band 2203, a display portion 2204, an optical system 2205, and an EL display device 2206. The present invention can be used in the EL display device 2206.

Figure 22D:
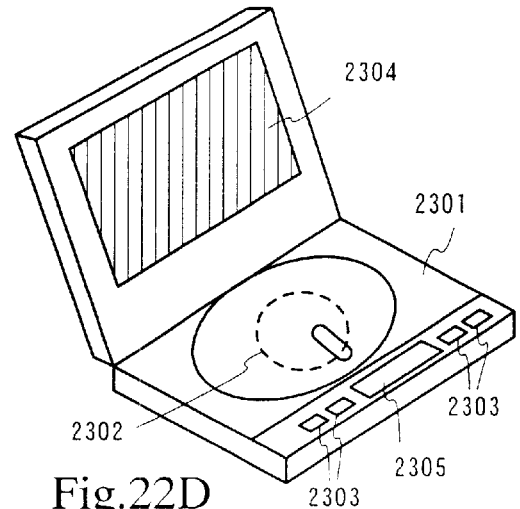

FIG. 22D is an image playback device (specifically, a DVD playback device) provided with a recording medium, containing a main body 2301, a recording medium (such as a DVD) 2302, operation switches 2303, a display portion (a) 2304, and a display portion (b) 2305. The display portion (a) is mainly used for displaying image information, and the image portion (b) is mainly used for displaying character information, and the EL display device of the present invention can be used in the image portion (a) and in the image portion (b). Note that domestic game equipment is included as the image playback device provided with a recording medium.

Figure 22E:
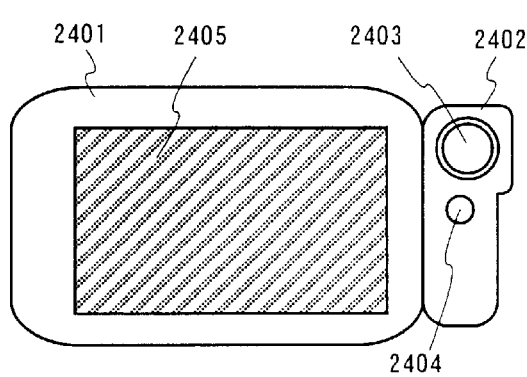

FIG. 22E is a mobile computer, containing a main body 2401, a camera portion 2402, an image receiving portion 2403, operation switches 2404, and a display portion 2405. The EL display device of the present invention can be used in the display portion 2405.

Figure 22F:
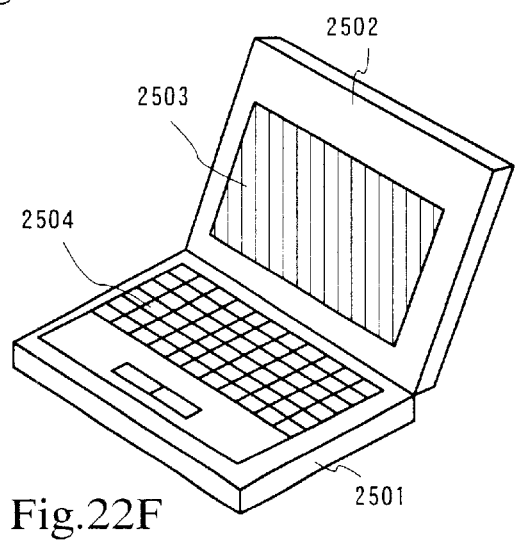

FIG. 22F is a personal computer, containing a main body 2501, a casing 2502, a display portion 2503, and a keyboard 2504. The EL display device of the present invention can be used in the display portion 2503.

Note that in the future if the emission luminance of EL materials becomes higher, the projection of light including outputted images can be enlarged by lenses or the like. Then it will become possible to use the EL display device of the present invention in a front type or a rear type projector.

The above electronic devices are becoming more often used to display information provided through an electronic transmission circuit such as the Internet or CATV (cable television), and in particular, opportunities for displaying animation information are increasing. The response speed of EL materials is extremely high, and therefore the EL display device is favorable for performing animation display. However, the contours between pixels become hazy, whereby the entire animation also becomes hazy. Accordingly, it is extremely effective to use the EL display device of the present invention in the display portion of electronic equipment because of its capability of clarifying the contours between pixels.

The emitting portion of the EL display device consumes power, and therefore it is preferable to display information so as to have the emitting portion become as small as possible. Therefore, when using the EL display device in a display portion which mainly displays character information, such as a portable information terminal, in particular, a portable telephone and an audio reproducing device, it is preferable to drive it by setting non-emitting portions as background and forming character information in emitting portions.

Figure 23A:
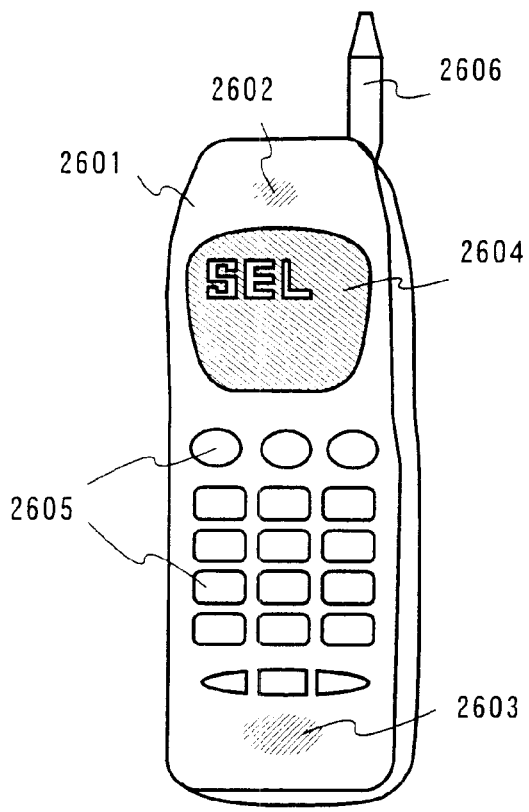
FIGS. 23A and 23B are views showing specific examples of electronic instruments.

FIG. 23A is a portable telephone, containing a main body 2601, an audio output portion 2602, an audio input portion 2603, a display portion 2604, operation switches 2605, and an antenna 2606. The EL display device of the present invention can be used in the display portion 2604. Note that by displaying white characters in a black background in the display portion 2604, the power consumption of the portable telephone can be reduced.

Figure 23B:
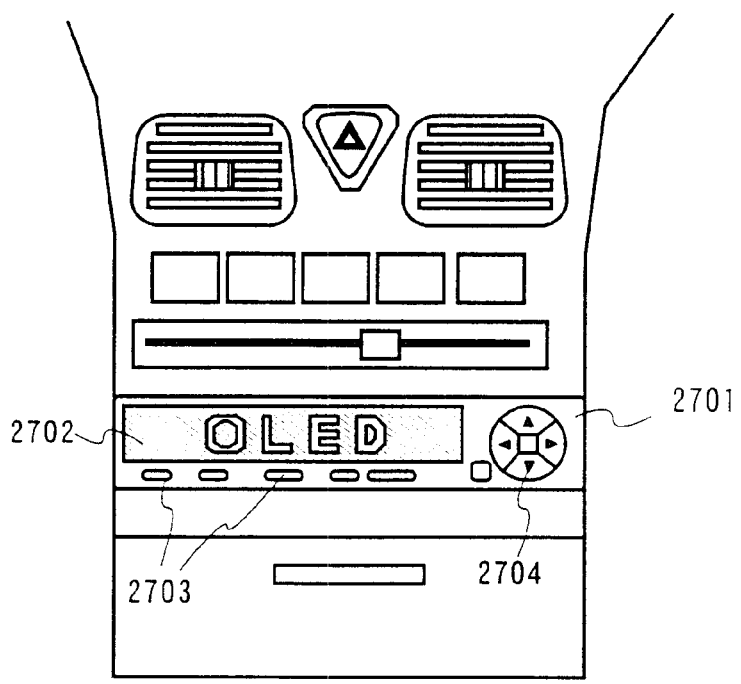

FIG. 23B is an audio reproducing device, specifically a car audio system, containing a main body 2701, a display portion 2702, and operation switches 2703 and 2704. The EL display device of the present invention can be used in the display portion 2702. Furthermore, an audio reproducing device for a car is shown in Embodiment 12, but it may also be used for a mobile type and a domestic type of audio reproducing device. Note that by displaying white characters in a black background in the display portion 2704, the power consumption can be reduced. This is particularly effective in a mobile type audio reproducing device.

The range of applications of the present invention is thus extremely wide, and it is possible to apply the present invention to electronic devices in all fields. Furthermore, any constitution of the EL display device shown in Embodiments 1 to 11 may be employed in the electronic devices of Embodiment 12.

Embodiment 13

In the present invention, it is also possible to use an EL material (also called a triplet compound) which can use phosphorescence from triplet exciton as light emission. A self-light-emitting device using the EL material which can use the phosphorescence as luminescence can remarkably improve external light emission quantum efficiency. Accordingly, it becomes possible to lower the electric power consumption of an EL element, to prolong the life thereof, and to lighten the weight thereof.

In the case where the EL material is used in the present invention, it is dissolved in an organic solvent and used. As a typical solvent, there is ethanol, xylene, chlorobenzene, dichlorobenzene, anisole, chloroform, dichloromethane, ã-butyllactone, butyl cellosolve, cyclohexane, NMP (N-methyl-2-pyrrolidone), cyclohexanone, dioxane, or THF (tetrahydrofuran).

Here, there are reports in which triplet exciton is used and external light emission quantum efficiency is improved. (T. Tsutsui, C. Adachi, S. Saito, Photochemical Processes in Organized Molecular Systems, ed. K. Honda, (Elsevier Sci. Pub., Tokyo, 1991) p. 437.)

A molecular formula of EL material (coumarin pigment) reported in the above paper is as follows:
Chemical Formula 6

(M. A. Baldo, D. F. O'Brien, Y. You, A. Shoustikov, S. Sibley, M. E. Thompson, S. R. Forrest, Nature 395 (1988) p. 151.)

A molecular formula of EL material (Pt complex) reported in the above paper is as follows:
Chemical Formula 7

(M. A. Baldo, S. Lamansky, P. E. Burrrows, M. E. Thompson, S. R. Forrest, Appl. Phys. Lett., 75 (1999) p. 4.)
(T. Tsutsui, M.-J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.)

A molecular formula of EL material (Ir complex) reported in the above paper is as follows:

Chemical Formula 8

As described above, if phosphorescence emission from triplet exciton can be used, it becomes possible to realize 3 to 4 times as high external light emission quantum efficiency as the case of using fluorescence light emission from single exciton, in principle.

Note that the structure of this embodiment can be freely combined with any structure of Embodiments 1 to 12.

By carrying out the present invention, it becomes possible to certainly form a film of organic EL material without a problem such as flying deflection in the inkjet system. That is, since a polymer organic EL material can be precisely formed into a film without a problem of position shift, the manufacture yield of an EL display device using the polymer organic EL material can be improved, and the cost can be reduced. Further, a coating position of coating liquid is controlled immediately before coating, a common coating method can be used and wide application is possible.

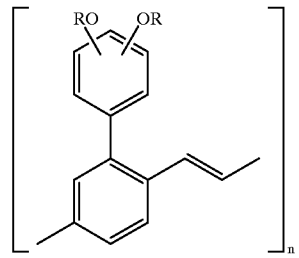

Chemical Formula 1

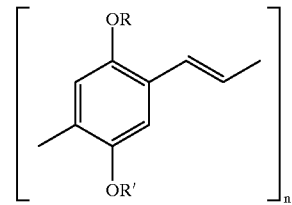

Chemical Formula 2

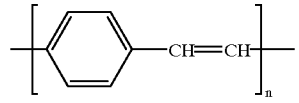

Chemical Formula 3

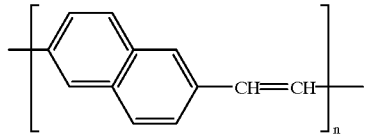

Chemical Formula 4

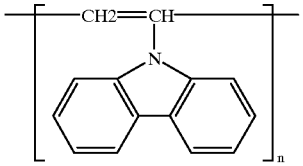

Chemical Formula 5

Chemical Formula 6

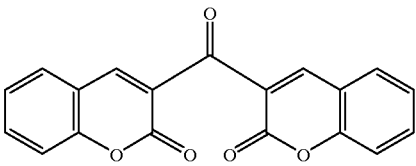

Chemical Formula 7

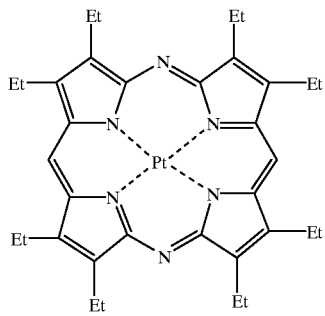

Chemical Formula 8

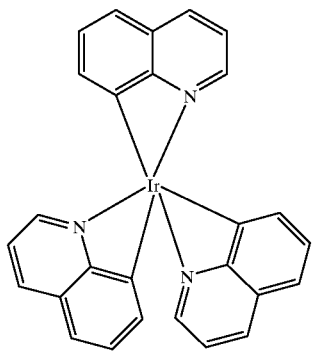

What is claimed is:

1. A film forming method comprising:
preparing an apparatus comprising:
a coating liquid chamber containing coating liquid;
a substrate provided with an electrode; and
a mask between the coating liquid chamber and the substrate;
forming atomized coating liquid in the coating liquid chamber; and
discharging the atomized coating liquid from the coating liquid chamber toward the substrate horizontally,
wherein the coating liquid passed through an opening portion of the mask,
wherein the coating liquid reaches the electrode on the substrate, and
wherein the coating liquid includes an EL material and a solvent.

2. A film forming method according to claim 1, wherein a voltage is applied to the mask.

3. A film forming method according to claim 1, wherein the atomized coating liquid is charged when the atomized coating liquid is discharged form the coating liquid chamber to the substrate.

4. A film forming method according to claim 1, wherein the opening portion of the mask is a gap of a blocking portion.

5. A film forming method according to claim 1, wherein the electrode is a pixel electrode.

6. A film forming method according to claim 1, wherein the coating liquid includes an organic material and a solvent.

7. A film forming method according to claim 1, wherein a thickness of the film is 10 nm to 1 $\mu$m.

8. A thin film forming method according to claim 1, wherein the mask is disposed vertically.

9. A thin film forming method according to claim 1, wherein the substrate is disposed vertically.

10. A thin film forming method comprising:
preparing an apparatus comprising:
a coating liquid chamber containing coating liquid;
a substrate provided with an electrode; and
a mask between the coating liquid chamber and the substrate;
forming atomized coating liquid in the coating liquid chamber; and
discharging the atomized coating liquid horizontally from the coating liquid chamber toward the substrate,
wherein the coating liquid passes through an opening portion of the mask,
wherein the coating liquid reaches the electrode on the substrate,
wherein the coating liquid includes an EL material and a solvent, and
wherein the substrate is disposed vertically.

11. A thin film forming method according to claim 10, wherein the mask is disposed vertically.

12. A thin film forming method according to claim 10, wherein a voltage is applied to the mask.

13. A thin film forming method according to claim 10, further comprising applying a voltage to the liquid.

14. A thin film forming method comprising:
preparing an apparatus comprising:
a coating liquid chamber containing coating liquid;
a substrate provided with an electrode; and
a mask between the coating liquid chamber and the substrate;
forming atomized coating liquid in the coating liquid chamber; and
discharging the atomized coating liquid horizontally from the coating liquid chamber toward the substrate,
wherein the coating liquid passes through an opening portion of the mask,
wherein the coating liquid reaches the electrode on the substrate,
wherein the coating liquid includes an EL material and a solvent, and
wherein the mask is disposed vertically.

15. A thin film forming method according to claim 14, wherein the substrate is disposed vertically.

16. A thin film forming method according to claim 14, wherein a voltage is applied to the mask.

17. A thin film forming method according to claim 14, further comprising applying a voltage to the liquid.

18. A thin film forming method comprising:
preparing an apparatus comprising:
a coating liquid chamber containing coating liquid;
a substrate provided with an electrode; and
a mask between the coating liquid chamber and the substrate;
forming atomized coating liquid in the coating liquid chamber; and
discharging the atomized coating liquid horizontally from the coating liquid chamber toward the substrate,
wherein the coating liquid passes through an opening portion of the mask, wherein the coating liquid reaches the electrode on the substrate, wherein the coating liquid includes an EL material and a solvent, and wherein a voltage is applied to the mask during coating the liquid.

19. A thin film forming method according to claim 18, wherein the mask is disposed vertically.

20. A thin film forming method according to claim 18, wherein the substrate is disposed vertically.

21. A thin film forming method according to claim 18, further comprising applying a voltage to the liquid.

22. A thin film forming method comprising:
preparing an apparatus comprising:
a coating liquid chamber containing coating liquid;
a substrate provided with an electrode; and
a mask between the coating liquid chamber and the substrate;
forming atomized coating liquid in the coating liquid chamber;
applying a voltage to the coating liquid; and
discharging the atomized coating liquid horizontally from the coating liquid chamber toward the substrate,
wherein the coating liquid passes through an opening portion of the mask,
wherein the coating liquid reaches the electrode on the substrate, and
wherein the coating liquid includes an EL material and a solvent.

23. A thin film forming method according to claim 22, wherein the mask is disposed vertically.

24. A thin film forming method according to claim 22, wherein the substrate is disposed vertically.

25. A thin film forming method according to claim 22, wherein a voltage is applied to the mask.

26. A thin film forming method comprising:
preparing an apparatus comprising:
a coating liquid chamber containing coating liquid;
a substrate provided with an electrode; and
a mask between the coating liquid chamber and the substrate;
forming atomized coating liquid in the coating liquid chamber; and
discharging the atomized coating liquid horizontally from the coating liquid chamber toward the substrate,
wherein the coating liquid passes through an opening portion of the mask,
wherein the coating liquid reaches the electrode on the substrate,
wherein the coating liquid includes an EL material and a solvent,
wherein the substrate is disposed vertically, and
wherein the mask is disposed vertically.

27. A thin film forming method according to claim 26, wherein a voltage is applied to the mask.

28. A thin film forming method according to claim 26, further comprising applying a voltage to the liquid.

29. A thin film forming method comprising:
preparing an apparatus comprising:
a coating liquid chamber containing coating liquid;
a substrate provided with an electrode; and
a mask between the coating liquid chamber and the substrate;
forming atomized coating liquid in the coating liquid chamber;
applying a first voltage to the coating liquid; and
discharging the atomized coating liquid horizontally from the coating liquid chamber toward the substrate,
wherein the coating liquid passes through an opening portion of the mask,
wherein the coating liquid reaches the electrode on the substrate,
wherein the coating liquid includes an EL material and a solvent, and
wherein a second voltage is applied to the mask during coating the liquid.

30. A thin film forming method according to claim 29, wherein the mask is disposed vertically.

31. A thin film forming method according to claim 29, wherein the substrate is disposed vertically.

32. A thin film forming method comprising:
preparing an apparatus comprising:
a coating liquid chamber containing coating liquid;
a substrate provided with an electrode; and
a mask between the coating liquid chamber and the substrate;
forming atomized coating liquid in the coating liquid chamber;
applying a first voltage to the coating liquid; and
discharging the atomized coating liquid horizontally from the coating liquid chamber toward the substrate,
wherein the coating liquid passes through an opening portion of the mask,
wherein the coating liquid reaches the electrode on the substrate,
wherein the coating liquid includes an EL material and a solvent,
wherein a second voltage is applied to the mask during coating the liquid, and
wherein the mask is disposed vertically.

33. A thin film forming method according to claim 32, wherein the substrate is disposed vertically.

* * * * *